US011315757B2

(12) United States Patent
Martinez et al.

(10) Patent No.: US 11,315,757 B2
(45) Date of Patent: Apr. 26, 2022

(54) METHOD AND APPARATUS TO ENHANCE SHEATH FORMATION, EVOLUTION AND PULSE TO PULSE STABILITY IN RF POWERED PLASMA APPLICATIONS

(71) Applicant: MKS Instruments, Inc., Andover, MA (US)

(72) Inventors: Linnell Martinez, San Jose, CA (US); Jonathan W. Smyka, Rochester, NY (US); Scott White, Wayland, NY (US); Aaron M. Burry, Ontario, NY (US)

(73) Assignee: MKS Instruments, Inc., Andover, MA (US)

( * ) Notice: Subject to any disclaimer, the term of this patent is extended or adjusted under 35 U.S.C. 154(b) by 50 days.

(21) Appl. No.: 16/986,680

(22) Filed: Aug. 6, 2020

(65) Prior Publication Data

US 2021/0050185 A1 Feb. 18, 2021

Related U.S. Application Data

(60) Provisional application No. 62/886,279, filed on Aug. 13, 2019.

(51) Int. Cl.
*H01J 37/32* (2006.01)
(52) U.S. Cl.
CPC .. *H01J 37/32155* (2013.01); *H01J 37/32183* (2013.01); *H01J 2237/327* (2013.01)
(58) Field of Classification Search
CPC .......... H01J 37/32155; H01J 37/32183; H01J 2237/327; G01S 19/24; H04L 7/007
See application file for complete search history.

(56) References Cited

U.S. PATENT DOCUMENTS

| 7,602,127 | B2 | 10/2009 | Coumou |
| 8,110,991 | B2 | 2/2012 | Coumou |
| 8,395,322 | B2 | 3/2013 | Coumou |
| 8,576,013 | B2 | 11/2013 | Coumou |
| 8,952,765 | B2 | 2/2015 | Fisk, II et al. |
| 9,041,471 | B2 | 5/2015 | Coumou |
| 9,876,476 | B2 | 1/2018 | Coumou et al. |
| 9,947,514 | B2 | 4/2018 | Radomski et al. |

(Continued)

FOREIGN PATENT DOCUMENTS

| CN | 100530529 C | 8/2009 |
| TW | 201828781 A | 8/2018 |

OTHER PUBLICATIONS

International Search Report and Written Opinion for PCT Patent App. No. PCT/US2020/045955 dated Nov. 18, 2020.

(Continued)

*Primary Examiner* — Henry Luong
(74) *Attorney, Agent, or Firm* — Harness, Dickey & Pierce, P.L.C.

(57) ABSTRACT

A radio frequency (RF) generator is configured to generate a RF signal. The RF signal can be modulated by a pulse having one or multiple states. During an initial state at pulse initiation, the RF generator adjusts the impedance match by selecting the frequency of the RF signal. During a second state of the pulse, the RF generator adjusts the impedance match using a matching network. The first state includes controlling the RF generator to output a power burst, and the second state includes controlling the generator to output an operating power.

39 Claims, 20 Drawing Sheets

(56) References Cited

U.S. PATENT DOCUMENTS

| | | |
|---|---|---|
| 10,049,857 B2 | 8/2018 | Fisk, II et al. |
| 10,217,609 B2 | 2/2019 | Fisk, II et al. |
| 10,269,540 B1 | 4/2019 | Carter et al. |
| 10,546,724 B2 | 1/2020 | Radomski et al. |
| 10,821,542 B2 | 11/2020 | Nelson et al. |
| 2007/0006971 A1 | 1/2007 | Shannon et al. |
| 2014/0263199 A1 | 9/2014 | Nelson et al. |
| 2015/0371876 A1 | 12/2015 | Terauchi et al. |
| 2016/0372933 A1 | 12/2016 | Voronin et al. |
| 2018/0254171 A1 | 9/2018 | Lee et al. |
| 2018/0301320 A1 | 10/2018 | Chen et al. |
| 2019/0013182 A1 | 1/2019 | Van Zyl |
| 2019/0066979 A1 | 2/2019 | Shoeb et al. |
| 2019/0108976 A1* | 4/2019 | Van Zyl ............ H01J 37/32183 |
| 2020/0411289 A1 | 12/2020 | Radomski et al. |

OTHER PUBLICATIONS

Office Action regarding Taiwanese Application No. 109127349, dated Feb. 15, 2022. Translation provided by AIPT Group.

* cited by examiner

METHOD AND APPARATUS TO ENHANCE SHEATH FORMATION, EVOLUTION AND PULSE TO PULSE STABILITY IN RF POWERED PLASMA APPLICATIONS

CROSS-REFERENCE TO RELATED APPLICATIONS

This application claims the benefit of U.S. Provisional Application No. 62/886,279, filed on Aug. 13, 2019. The entire disclosure of the above application is incorporated herein by reference.

FIELD

The present disclosure relates to RF generator systems and control of RF generators.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Plasma fabrication is frequently used in semiconductor fabrication. In plasma fabrication etching, ions are accelerated by an electric field to etch material from or deposit material onto a surface of a substrate. In one basic implementation, the electric field is generated based on Radio Frequency (RF) or Direct Current (DC) power signals generated by a respective RF or DC generator of a power delivery system. The power signals generated by the generator must be precisely controlled to effectively execute plasma etching.

SUMMARY

A radio frequency (RF) generator including a RF power source generating an output signal including a RF signal modulated by a pulse that varies in accordance with power to be delivered to a load. The RF generator includes a controller configured to control the pulse to include a plurality of states. In a first state, the controller is configured to control the RF generator to output the RF signal at a first power value and to control a frequency of the RF signal to a first frequency to vary an impedance between the RF generator and the load. In a second state, the controller is configured to operate in at least one of four modes. In a first mode the controller controls the RF generator to output the RF signal at a second power value and control the frequency of the RF signal irrespective of the impedance between the RF generator and the load, wherein the first power value is a burst power and the second power value is a working power. In a second mode the controller controls the RF generator to output the RF signal at the second power value and control the frequency of the RF signal to vary the impedance between the RF generator and the load, wherein the first power value is the burst power and the second power value is the working power. In a third mode the controller controls the RF generator to output the RF signal at the second power value and control the frequency of the RF signal irrespective of the impedance between the RF generator and the load, wherein the first power value exceeds the second power value. In a fourth mode the controller controls the RF generator to output the RF signal at the second power value and control the frequency of the RF signal to vary the impedance between the RF generator and the load, wherein the first power value exceeds the second power value.

A radio frequency (RF) generator system including a RF power source generating an output signal including a RF signal modulated by a pulse that varies in accordance power to be delivered to a load, wherein the pulse includes a plurality of states. A controller is configured to control the RF generator. In a first state including a plurality of bins, the controller is configured to (a) control the RF generator to output a a plurality of frequencies within each bin, and the controller is configured to control the RF generator to output the RF signal at at least one first power value. In in a second state, the controller is further configured in a mode (a) to control the RF generator to output the RF signal at a second power value.

A controller is configured to control a pulse output by a RF power source. The RF power source generates an output signal including a RF signal modulated by a pulse that varies in accordance power to be delivered to a load. In a first state, the controller is configured to control the RF generator to output the RF signal at a first power value and to control a frequency of the RF signal to a first frequency to vary an impedance between the RF generator and the load. In a second state, the controller is further configured in a mode (a) to control the RF generator to output the RF signal at a second power value and control the frequency of the RF signal irrespective of the impedance between the RF generator and the load, wherein the first power value is a burst power and the second power value is a working power.

A method for controlling power delivery to a load includes controlling a RF power generator to generate a RF output signal modulated by a pulse to vary power delivered to the load. The method includes a first state controlling the RF generator to output the RF signal at a first power value at a first frequency to vary an impedance between the RF generator and the load. The method includes a second state controlling in a mode (a) to output the RF signal at a second power value and control the frequency of the RF signal irrespective of the impedance between the RF generator and the load, wherein the first power value is a burst power and the second power value is a working power.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

In the drawings, reference numbers may be reused to identify similar and/or identical elements.

DESCRIPTION

Figure 1:
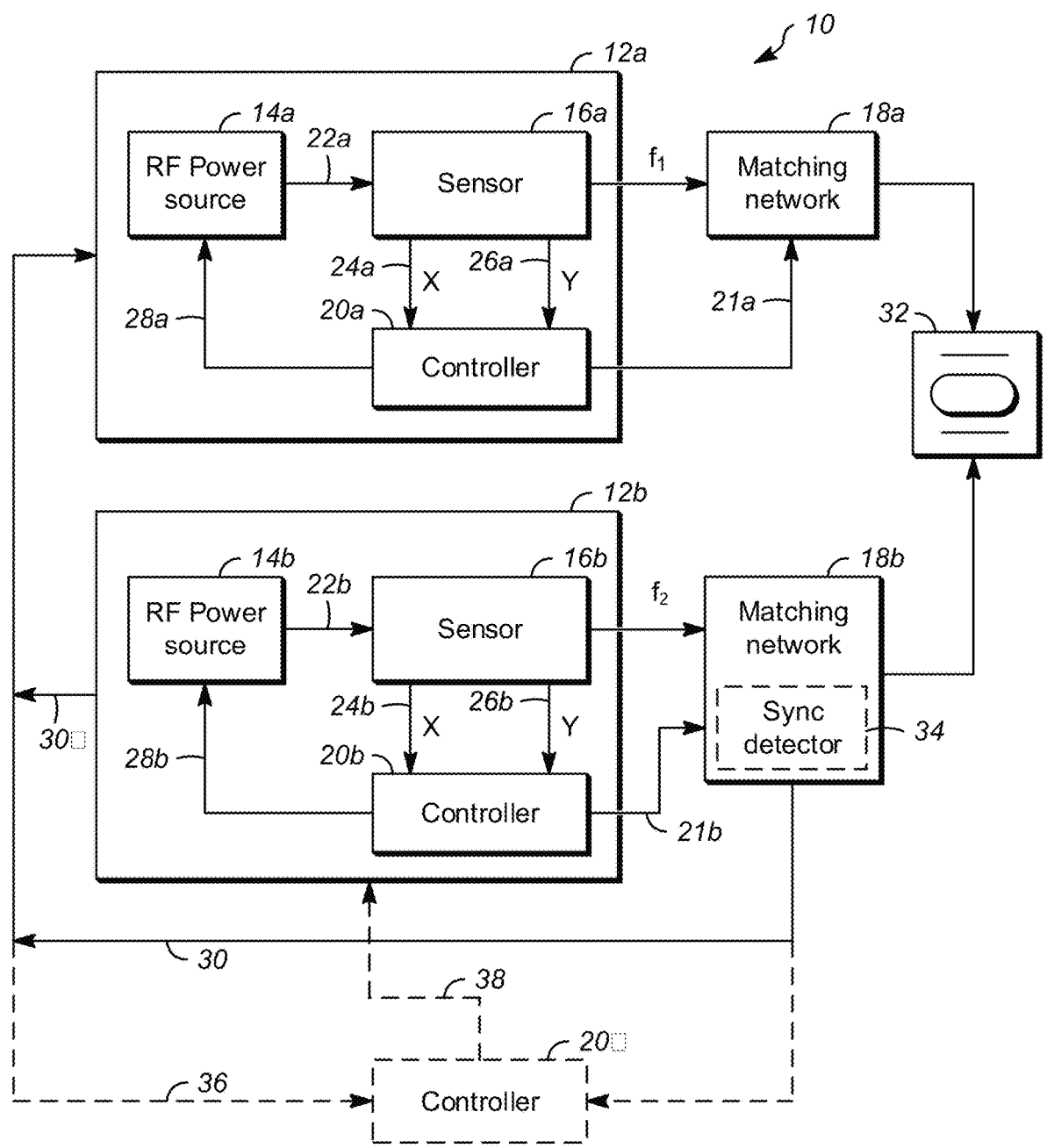
FIG. 1 shows a schematic block diagram of a power delivery system for multiple power supplies arranged in accordance with the present disclosure.

A power system may include a DC or RF power generator, a matching network, and a load (such as a process chamber, a plasma chamber, or a reactor having a fixed or variable impedance). The power generator generates a DC or RF power signal, which is received by the matching network or impedance optimizing controller or circuit. The matching network or impedance optimizing controller or circuit matches an input impedance of the matching network to a characteristic impedance of a transmission line between the power generator and the matching network. The impedance matching aids in maximizing an amount of power forwarded to the matching network ("forward power") and minimizing an amount of power reflected back from the matching network to the power generator ("reverse power"). Forward power may be maximized and reverse power may be minimized when the input impedance of the matching network matches the characteristic impedance of the transmission line and generator.

In the power source or power supply field, there are typically two approaches to applying a power signal to the load. A first, more traditional approach is to apply a continuous power signal to the load. In a continuous mode or continuous wave mode, a continuous power signal is typically a constant DC or sinusoidal RF power signal that is output continuously by the power source to the load. In the continuous mode approach, the power signal assumes a constant DC or sinusoidal output, and the amplitude of the power signal and/or frequency (of a RF power signal) can be varied in order to vary the output power applied to the load.

A second approach to applying the power signal to the load involves pulsing a RF signal, rather than applying a continuous RF signal to the load. In a pulse mode of operation, a RF signal is modulated by a modulation signal in order to define an envelope for the modulated power signal. The RF signal may be, for example, a sinusoidal RF signal or other time varying signal. Power delivered to the load is typically varied by varying the modulation signal.

In a typical power supply configuration, output power applied to the load is determined by using sensors that measure the forward and reflected power or the voltage and current of the RF signal applied to the load. Either set of these signals is analyzed in a control loop. The analysis typically determines a power value which is used to adjust the output of the power supply in order to vary the power applied to the load. In a power delivery system where the load is a process chamber or other non-linear or time varying load, the varying impedance of the load causes a corresponding varying of power applied to the load, as applied power is in part a function of the impedance of the load.

In systems where fabrication of various devices relies upon introduction of power to a load to control a fabrication process, power is typically delivered in one of two configurations. In a first configuration, the power is capacitively coupled to the load. Such systems are referred to as capacitively coupled plasma (CCP) systems. In a second configuration, the power is inductively coupled to the load. Such systems are typically referred to as inductively coupled plasma (ICP) systems. Power coupling to the plasma can also be achieved via wave coupling at microwave frequencies. Such an approach typically uses Electron Cyclotron Resonance (ECR) or microwave sources. Helicon sources are another form of wave coupled source and typically operate at RF frequencies similar to that of conventional ICP and CCP systems. Power delivery systems may include at least one bias power and/or a source power applied to one or a plurality of electrodes of the load. The source power typically generates a plasma and controls plasma density, and the bias power modulates ions in the formulation of the sheath. The bias and the source may share the same electrode or may use separate electrodes, in accordance with various design considerations.

When a power delivery system drives a time-varying or non-linear load, such as a process chamber or plasma chamber, the power absorbed by the bulk plasma and plasma sheath results in a density of ions with a range of ion energy. One characteristic measure of ion energy is the ion energy distribution function (IEDF). The ion energy distribution function (IEDF) can be controlled with the bias power. One way of controlling the IEDF for a system in which multiple RF power signals are applied to the load occurs by varying multiple RF signals that are related by amplitude, frequency and phase. The relative amplitude, frequency and phase of multiple RF power signals may also be related by a Fourier series and the associated coefficients. The frequencies between the multiple RF power signals may be locked, and the relative phase between the multiple RF signals may also be locked. Examples of such systems can be found with reference to U.S. Pat. Nos. 7,602,127; 8,110,991; and 8,395,322, all assigned to the assignee of the present application and incorporated by reference in this application.

Time varying or non-linear loads may be present in various applications. In one application, plasma processing systems may also include components for plasma generation and control. One such component is a non-linear load implemented as a process chamber, such as a plasma chamber or reactor. A typical plasma chamber or reactor utilized in plasma processing systems, such as by way of example, for thin-film manufacturing, can utilize a dual power system. One power generator (the source) controls the generation of the plasma, and the power generator (the bias) controls ion energy. Examples of dual power systems include systems that are described in U.S. Pat. Nos. 7,602,127; 8,110,991; and 8,395,322, referenced above. The dual power system described in the above-referenced patents requires a closed-loop control system to adapt power supply operation for the purpose of controlling ion density and its corresponding ion energy distribution function (IEDF).

Multiple approaches exist for controlling a process chamber, such as may be used for generating plasmas. For example, in RF power delivery systems, phase and frequency of multiple driving RF signals operating at the same or nearly the same frequency may be used to control plasma generation. For RF driven plasma sources, the periodic waveform affecting plasma sheath dynamics and the corresponding ion energy are generally known and are controlled by the frequency of the periodic waveforms and the associated phase interaction. Another approach in RF power delivery systems involves dual frequency control. That is, two RF frequency sources operating at different frequencies are used to power a plasma chamber to provide substantially independent control of ion and electron densities.

Another approach utilizes wideband RF power sources to drive a plasma chamber. A wideband approach presents certain challenges. One challenge is coupling the power to the electrode. A second challenge is that the transfer function of the generated waveform to the actual sheath voltage for a desired IEDF must be formulated for a wide-process space to support material surface interaction. In one responsive approach in an inductively coupled plasma system, controlling power applied to a source electrode controls the plasma density while controlling power applied to the bias electrode modulates ions to control the IEDF to provide etch rate control. By using source electrode and bias electrode control, the etch rate is controlled via the ion density and energy.

As integrated circuit and device fabrication continues to evolve, so do the power requirements for controlling the process for fabrication. For example, with memory device fabrication, the requirements for bias power continue to increase. Increased power generates higher energetic ions for faster surface interaction, thereby increasing the etch rate and directionality of ions. In RF systems, increased bias power is sometimes accompanied by a lower bias frequency requirement along with an increase in the number of bias power sources coupled to the plasma sheath created in the plasma chamber. The increased power at a lower bias frequency and the increased number of bias power sources results in intermodulation distortion (IMD) emissions from a sheath modulation. The IMD emissions can significantly reduce power delivered by the source where plasma generation occurs. U.S. Pat. No. 10,821,542, issued on Nov. 3, 2020 and entitled Pulse Synchronization by Monitoring Power in Another Frequency Band, assigned to the assignee of the present application and incorporated by reference herein, describes a method of pulse synchronization by monitoring power in another frequency band. In the referenced U.S. patent, the pulsing of a second RF generator is controlled in accordance with detecting at the second RF generator the pulsing of a first RF generator, thereby synchronizing pulsing between the two RF generators.

FIG. 1 depicts a RF generator or power supply system 10. Power supply system 10 includes a pair of radio frequency (RF) generators or power supplies 12a, 12b, matching networks 18a, 18b, and load 32, such as a non-linear load, which may be a plasma chamber, process chamber, and the like. In various embodiments, RF generator 12a is referred to as a source RF generator or power supply, and matching network 18a is referred to as a source matching network. Also in various embodiments, RF generator 12b is referred to as a bias RF generator or power supply, and matching network 18b is referred to as a bias matching network. It will be understood that the components can be referenced individually or collectively using the reference number without a letter subscript or a prime symbol.

In various embodiments, source RF generator 12a receives a control signal 30 from matching network 18b, generator 12b, or a control signal 30' from bias RF generator 12b. As will be explained in greater detail, control signal 30 or 30' represents an input signal to power supply 12a that indicates one or more operating characteristics or parameters of bias RF generator 12b. In various embodiments, a synchronization detector 34 senses the RF signal output from matching network 18b to load 32 and outputs a synchronization or trigger signal 30 to power supply 12a. In various embodiments, synchronization or trigger signal 30' may be output from power supply 12b to power supply 12a, rather than trigger signal 30. A difference between trigger or synchronization signals 30, 30' may result from the effect of matching network 18b, which can change the phase between the input signal to and output signal from matching network 18b. Signals 30, 30' include information about the operation of bias RF generator 12b that in various embodiments enables predictive responsiveness to address periodic fluctuations in the impedance of plasma chamber 32 caused by the bias generator 12b. When control signals 30 or 30' are absent, RF generators 12a, 12b operate autonomously.

RF generators 12a, 12b include respective RF power sources or amplifiers 14a, 14b, RF sensors 16a, 16b, and processors, controllers, or control modules 20a, 20b. RF power sources 14a, 14b generate respective RF power signals 22a, 22b output to respective sensors 16a, 16b. Sensors 16a, 16b receive the output of RF power sources 14a, 14b and generate respective RF power signals $f_1$ and $f_2$. Sensors 16a, 16b also output signals that vary in accordance with various parameters sensed from load 32. While sensors 16a, 16b, are shown within respective RF generators 12a, 12b, RF sensors 16a, 16b can be located externally to the RF power generators 12a, 12b. Such external sensing can occur at the output of the RF generator, at the input of an impedance matching device located between the RF generator and the load, or between the output of the impedance matching device (including within the impedance matching device) and the load.

Sensors 16a, 16b detect operating parameters of load 32 and output signals X and Y. Sensors 16a, 16b may include voltage, current, and/or directional coupler sensors. Sensors 16a, 16b may detect (i) voltage V and current I and/or (ii) forward power $P_{FWD}$ output from respective power amplifiers 14a, 14b and/or RF generators 12a, 12b and reverse or reflected power $P_{REV}$ received from respective matching network 18a, 18b or load 32 connected to respective sensors 16a, 16b. The voltage V, current I, forward power $P_{FWD}$, and reverse power $P_{REV}$ may be scaled and/or filtered versions of the actual voltage, current, forward power, and reverse power associated with the respective power sources 14a, 14b. Sensors 16a, 16b may be analog and/or digital sensors. In a digital implementation, the sensors 16a, 16b may include analog-to-digital (A/D) converters and signal sampling components with corresponding sampling rates. Signals X and Y can represent any of the voltage V and current I or forward (or source) power $P_{FWD}$, reverse (or reflected) power $P_{REV}$.

Sensors 16a, 16b generate sensor signals X, Y, which are received by respective controllers or power control modules 20a, 20b. Power control modules 20a, 20b process the respective X, Y signals 24a, 26a and 24b, 26b and generate one or a plurality of feedback control signals 28a, 28b to respective power sources 14a, 14b. Power sources 14a, 14b adjust the RF power signals 22a, 22b based on the received feedback control signal. In various embodiments, power control modules 20a, 20b may control matching networks 18a, 18b, respectively, via respective control signals 21a, 21b. Power control modules 20a, 20b may include, at least, proportional integral derivative (PID) controllers or subsets thereof and/or direct digital synthesis (DDS) component(s) and/or any of the various components described below in connection with the modules.

In various embodiments, power control modules 20a, 20b are PID controllers or subsets thereof and may include functions, processes, processors, or submodules. Feedback control signals 28a, 28b may be drive signals and may include DC offset or rail voltage, voltage or current magnitude, frequency, and phase components. In various embodiments, feedback control signals 28a, 28b can be used as inputs to one or multiple control loops. In various embodiments, the multiple control loops can include a proportional-integral-derivative (PID) control loop for RF drive, and for rail voltage. In various embodiments, feedback control signals 28a, 28b can be used in a Multiple Input Multiple Output (MIMO) control scheme. An example of a MIMO control scheme can be found with reference to U.S. Pat. No. 10,546,724, issued on Jan. 28, 2020, entitled Pulsed Bidirectional Radio Frequency Source/Load and assigned to the assignee of the present application, and incorporated by reference herein.

In various embodiments, power supply system 10 can include controller 20'. Controller 20' may be disposed externally to either or both of RF generators 12a, 12b and may be referred to as external or common controller 20'. In various embodiments, controller 20' may implement one or a plurality of functions, processes, or algorithms described herein with respect to one or both of controllers 20a, 20b. Accordingly, controller 20' communicates with respective RF generators 12a, 12b via a pair of respective links 36, 38 which enable exchange of data and control signals, as appropriate, between controller 20' and RF generators 12a, 12b. For the various embodiments, controllers 20a, 20b, 20' can distributively and cooperatively provide analysis and control along with RF generators 12a, 12b. In various other embodiments, controller 20' can provide control of RF generators 12a, 12b, eliminating the need for the respective local controllers 20a, 20b.

In various embodiments, RF power source 14a, sensor 16a, controller 20a, and matching network 18a can be referred to as source RF power source 14a, source sensor 16a, source controller 20a, and source matching network 18a. Similarly in various embodiments, RF power source 14b, sensor 16b, controller 20b, and matching network 18b can be referred to as bias RF power source 14b, bias sensor 16b, bias controller 20b, and bias matching network 18b. In various embodiments and as described above, the source term refers to the RF generator that generates a plasma, and the bias term refers to the RF generator that tunes the plasma Ion Energy Distribution Function (IEDF). In various embodiments, the source and bias RF power supplies operate at different frequencies. In various embodiments, the source RF power supply operates at a higher frequency than the bias RF power supply. In various other embodiments, the source and bias RF power supplies operate at the same frequencies or substantially the same frequencies.

Figure 2:
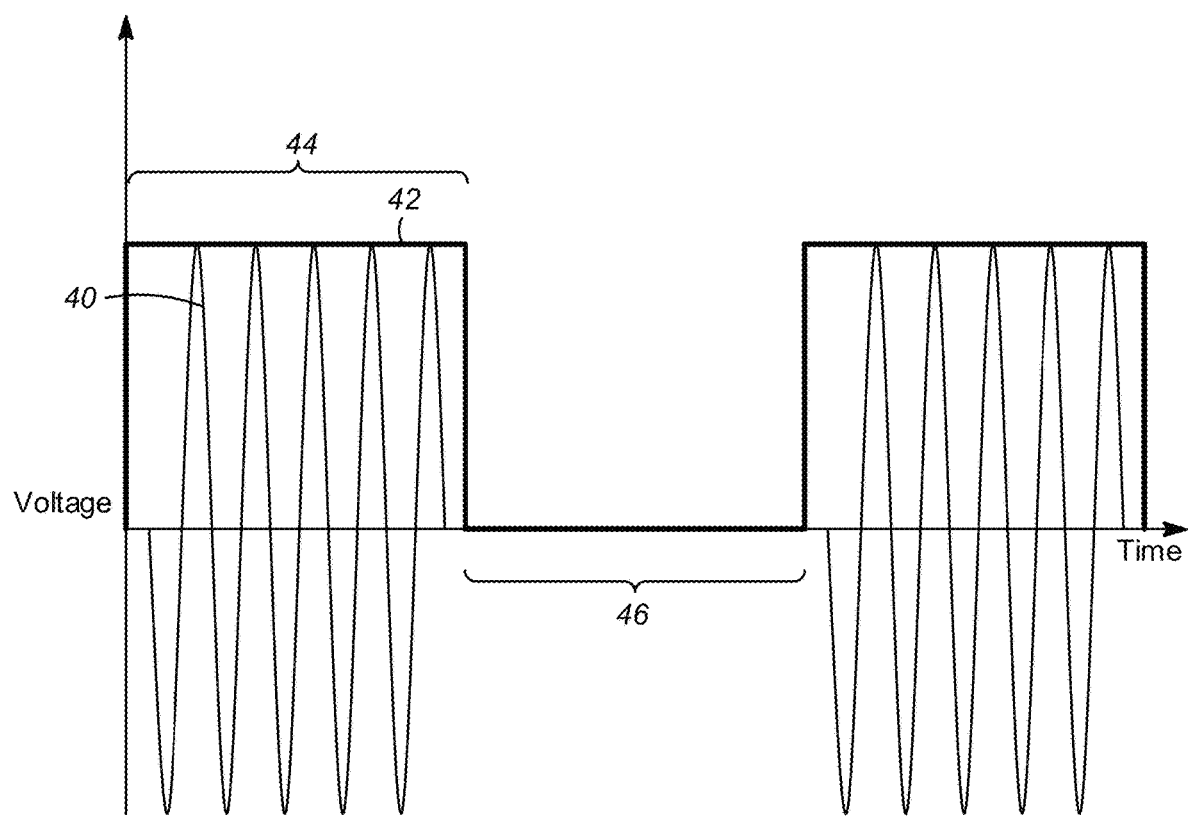
FIG. 2 shows waveforms of a RF signal and a pulse modulating the RF signal.

FIG. 2 depicts a plot of voltage versus time to describe a pulse mode of operation for delivering power to a load, such as load 32 of FIG. 1. In FIG. 2, RF signal 40 is modulated by pulse 42. As shown at period or region 44 of pulse 42, when pulse 42 is ON, RF generator 12 outputs RF signal 40. Conversely, during period or region 46 of pulse 42, pulse 42 is OFF, and RF generator 12a does not output RF signal 40. Pulse signal 42 can repeat at a constant duty cycle or a variable duty cycle. Further, pulse signal 42 need not be embodied as a square wave as shown in FIG. 2. Further yet, pulse 42 can have multiple ON and OFF regions of varying amplitude and duration. The multiple regions may repeat within a fixed or variable period.

Figure 3:
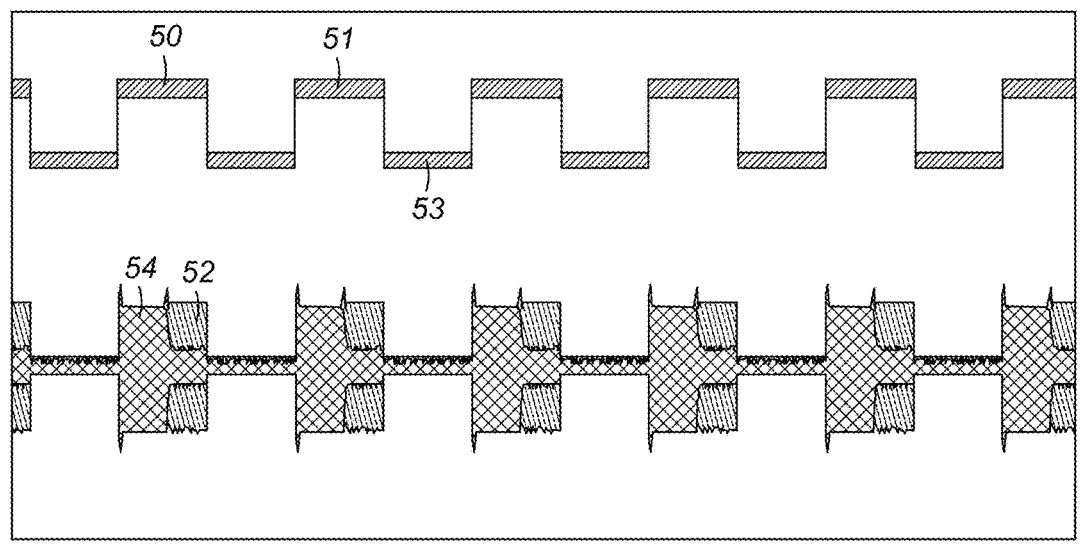
FIG. 3 shows a plot of a pulse, forward voltage, and reverse voltage versus time for a conventionally configured power delivery system.

FIG. 3 depicts exemplary waveforms representing application of a pulsed RF signal applied to load 32 of FIG. 1, such as a process chamber or a plasma chamber. In FIG. 3, pulse 50 is a square wave having an ON period or region 51 and an OFF period or region 53. FIG. 3 also indicates the forward and reflected voltage, with waveform 52 indicating forward voltage and waveform 54 indicating reverse voltage. As can be seen in FIG. 3, at the start of pulse 51, reflected voltage 54 is high and approximately equal to the forward voltage 52, indicative of very little to no power reaching load 32. In the latter half of the ON region 51 of pulse waveform 50, reverse voltage 54 diminishes significantly relative to the forward voltage. This is an indication that the majority of the power output by the generator is delivered to the load. As can be seen in FIG. 3, reverse voltage 54 dominates a substantial portion, approximately 50%, of the ON region 51 of pulse waveform 50, indicating power delivery voltage to the load only during the latter half of the ON region 51 of pulse waveform 50.

Figure 4:
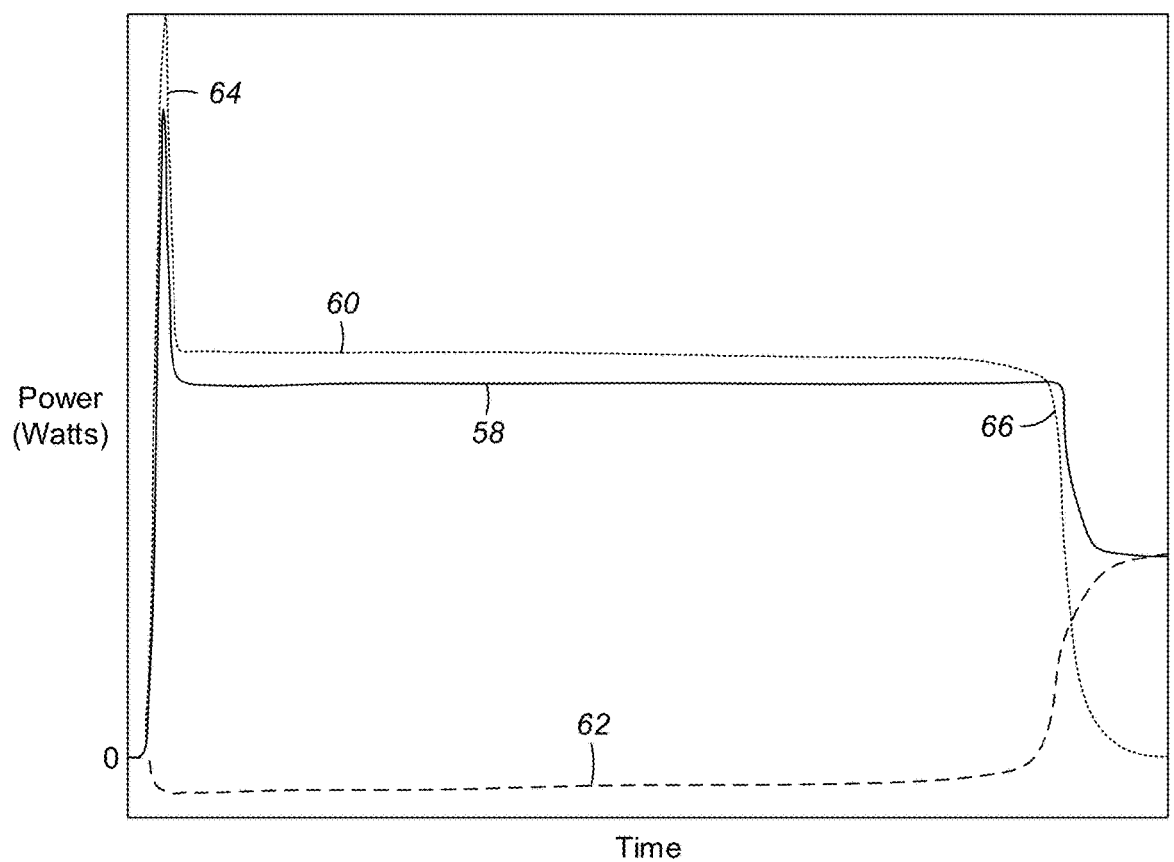
FIG. 4 shows a plot of forward power, reverse power, and delivered power versus time corresponding to the waveforms of FIG. 3.

FIG. 4 depicts a plot of power versus time for reflected or reverse power 60 and forward power 58. FIG. 4 also depicts a waveform of delivered power 62, which is generally defined as a difference between forward power 58 and reverse power 60. FIG. 4 shows a time period of approximately the first 50% of a pulse of FIG. 3. Over time, reverse power 60 peaks at 64 and decreases to zero, starting to decrease approximately at position 66. As reverse power 60 decreases to zero, forward power 58 also decreases so that the delivered power 62 is substantially equal to the forward power 58. FIG. 4 is an exemplary illustration of a slow forming sheath with a substantial delay.

Figure 5:
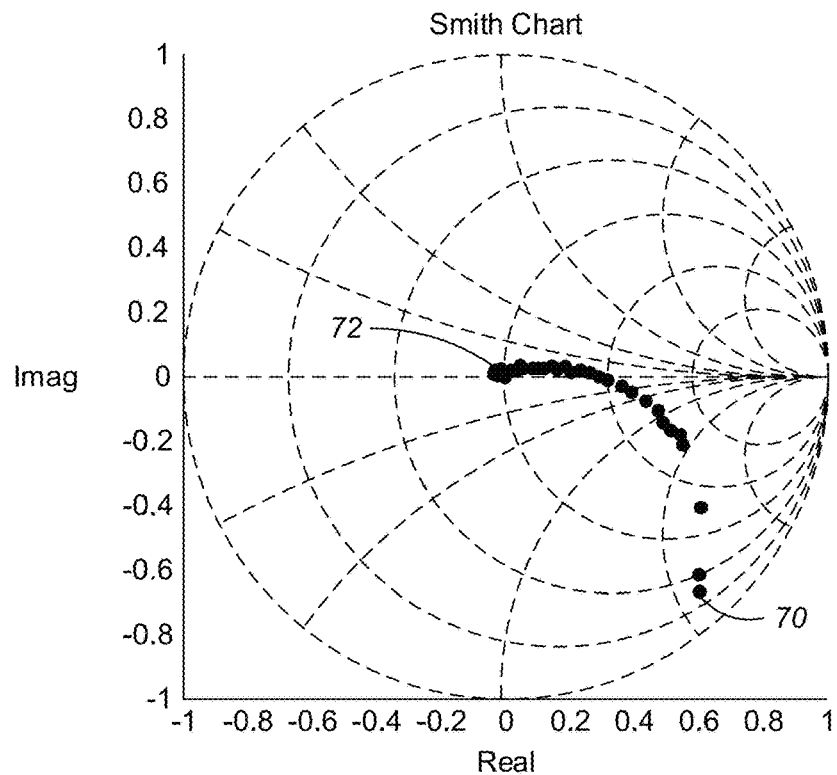
FIG. 5 shows a Smith chart indicating the sheath forming trajectory of the impedance during a pulse at the output of the generator.
Figure 6:
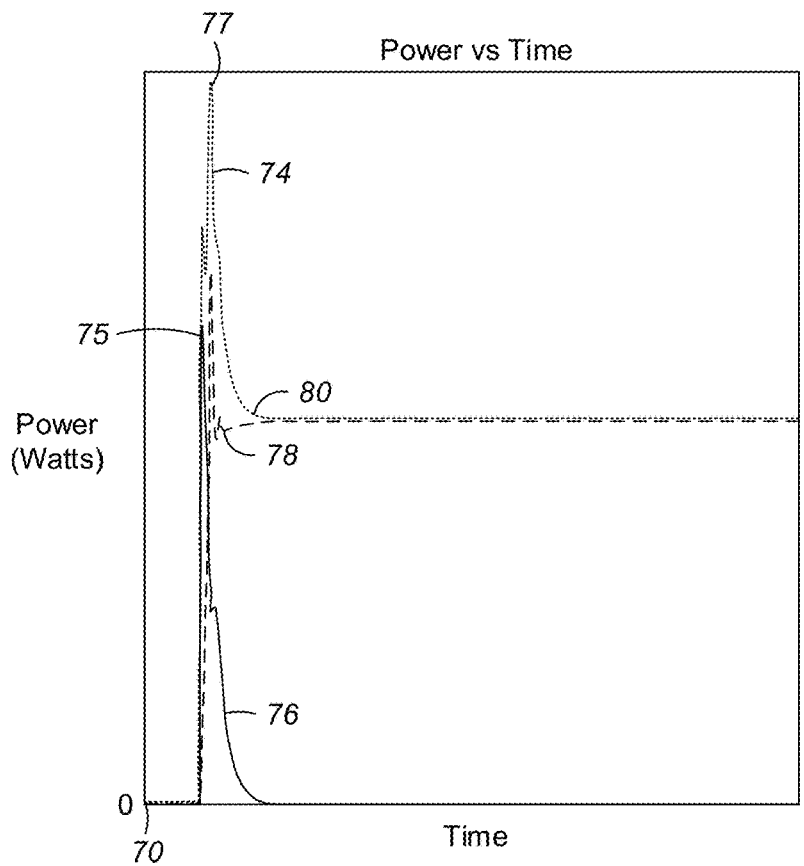
FIG. 6 shows a plot of forward power, reverse power, and delivered power versus time corresponding to the Smith chart of FIG. 5.

FIGS. 5 and 6 depict a respective Smith chart and a plot of power versus time as the plasma sheath evolves from a floating sheath to the steady state RF powered sheath. The matching network is tuned to the steady portion of the pulse and the sheath evolution is depicted by the trajectory moving and ending at or near 50 ohms impedance over an initial period of a pulse. FIG. 5 is a Smith Chart based on detection of electrical parameters measured at the output of an RF generator. In FIG. 5, the trajectory initially starts at position 70 near the outside of the Smith chart, and the impedance progresses from position 70 to position 72, indicating a transition from near the outside of the Smith chart to 50 ohms impedance. FIG. 6 thus depicts a transition from position 70 to position 72, indicating 50 ohms impedance.

As can be seen in FIG. 6, in the transition from position 70 through 72, forward power waveform 74 peaks at position 77 shortly after pulse initiation 70, and reverse power waveform 76 indicates a peak at position 75, but at a power less than forward power peak 77. Waveform 78 indicates delivered power as it quickly increases to a substantially constant value near or at position 80. FIG. 6 is an exemplary illustration of a fast forming sheath with a minimal delay.

One approach to improving the delivery of power to a load, such as load 32, involves applying a power burst at a burst power upon initiation of a pulse. When applying a power burst, upon initiation of a pulse, amplitude of the RF power is increased by the RF power source 14 of RF generator 12 for a relatively short time in order to accelerate sheath formation in the plasma. Following the power burst, the amplitude of the RF generator is returned to a working or operating level for the balance of the ON region of the pulse. A successful burst can be measured in various aspects. In one aspect, sheath formation within 30-40 μs can be considered a successful burst.

Figure 7:
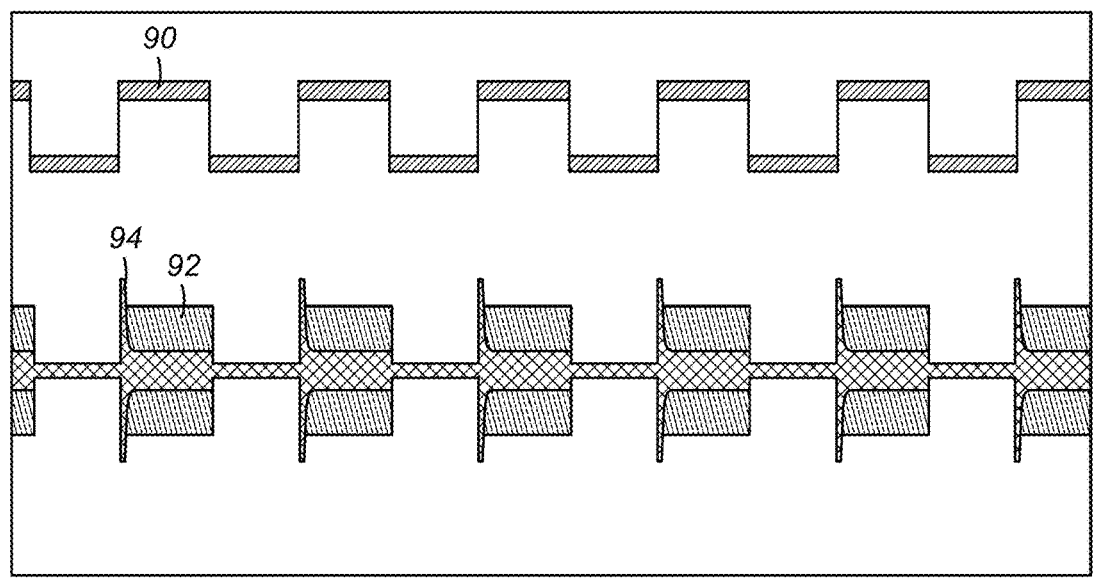
FIG. 7 shows a plot of a pulse, forward voltage, and reverse voltage versus time for a conventionally configured power delivery system operating in a burst mode.
Figure 8:
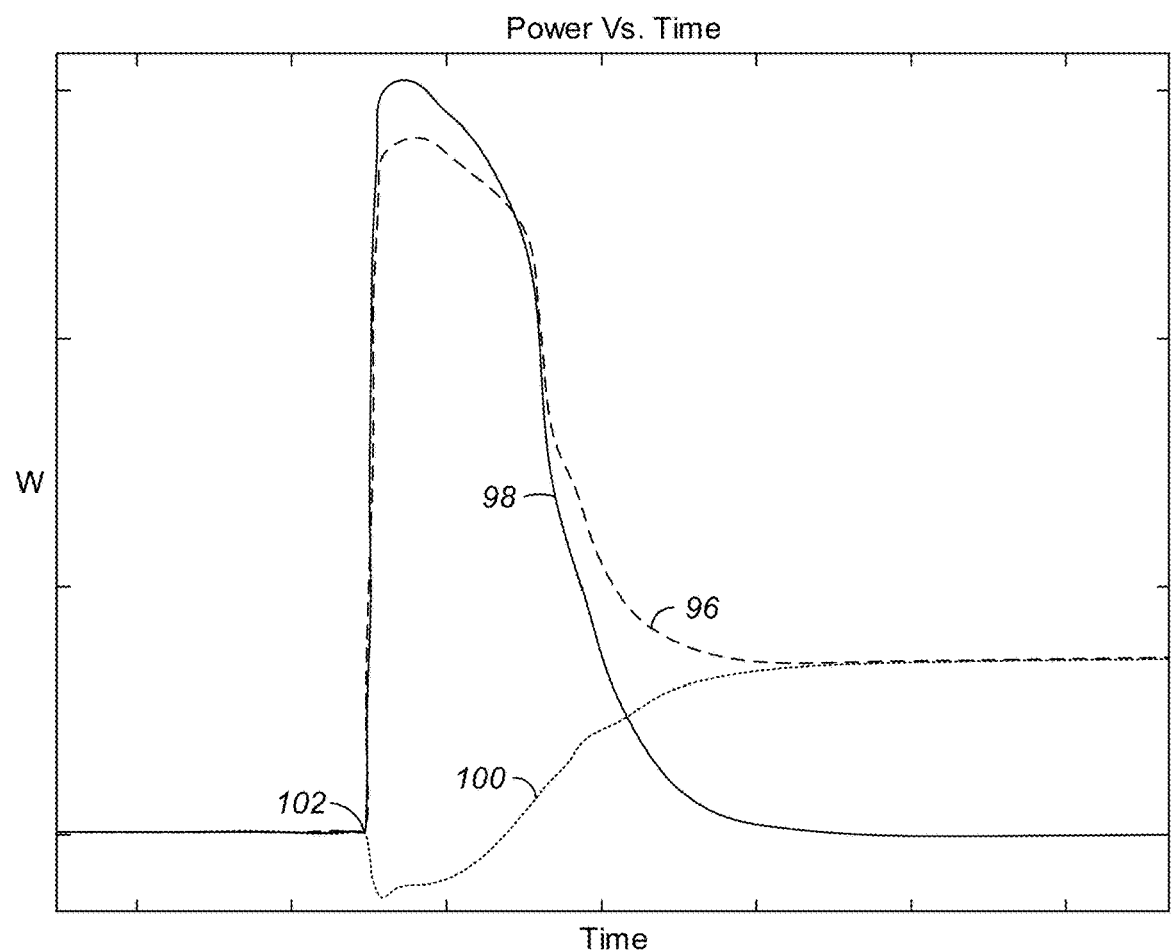
FIG. 8 shows a plot of forward power, reverse power, and delivered power versus time corresponding to the waveforms of FIG. 7.

FIG. 7 depicts waveforms of a pulse, forward voltage, and reverse voltage and power versus time in FIG. 8. In FIG. 7, waveform 90 indicates a pulse, waveform 92 indicates forward voltage, and waveform 94 indicates reverse voltage. As can be seen in FIG. 7, the reverse voltage 94 is high at the onset of the pulse, similar to the reverse voltage 54 of FIG. 3, but as seen in FIG. 8, the delivered power 100 begins to increase quickly within the power burst, in contrast to FIG. 4. With respect to the pulse initiation, reverse voltage 94 decreases sooner than reverse voltage 54 of FIG. 3, but as seen in FIG. 8, the delivered power 100 begins to increase quickly within the power burst, in contrast to FIG. 4. With respect to the pulse initiation, reverse voltage 94 decreases sooner than reverse voltage 54 of FIG. 3. Thus, FIG. 7 indicates that when applying a power burst, reverse voltage 94 decreases increases over a shorter period than in FIG. 3, allowing for sheath formation in a shorter time.

FIG. 8 depicts power with respect to time. As can be seen in FIG. 8, while forward power 96 and reverse power 98 peak relatively quickly after the power burst 102, reverse power 98 diminishes relatively quickly compared to FIG. 4, resulting in a corresponding relatively quick increase in delivered power 100. By way of non-limiting comparison between FIGS. 3 and 4 and FIGS. 7 and 8, by increasing the power during the power burst by approximately 25%, delivered power reaches a value that enables sheath formation approximately an order of magnitude faster than when not applying a power burst.

While applying a power burst can significantly decrease time to sheath formation, the power increase during the burst can prove stressful on the RF generator 12 of FIG. 1. One benefit of burst mode applying a power burst is that a matching network, such as matching network 18 can be configured to provide an optimum match shortly after the burst, thereby saving time to achieve a preferred solution for the matching network 18. However, each power burst results in the application of additional power, and the additional power results in additional heat, causing potential further stress on RF generator 12. Further, because the power burst depicted in FIGS. 7 and 8 uses the auto tuning match feature typically available in matching networks 18, further stress on a generator results from the matching network 18 not being tuned to provide a 50 ohm match during the power burst at the beginning of a pulse. Thus, during the power burst, RF generator 12 may experience additional stress because a higher power is being generated when the matching network is not tuned to provide the optimal match at the higher burst power. However, some device manufacturers require that the RF generator operate in all phases or positions around a Smith chart, such as shown in FIG. 5, and applying a burst provides operation around a greater portion of the Smith chart.

Figure 9:
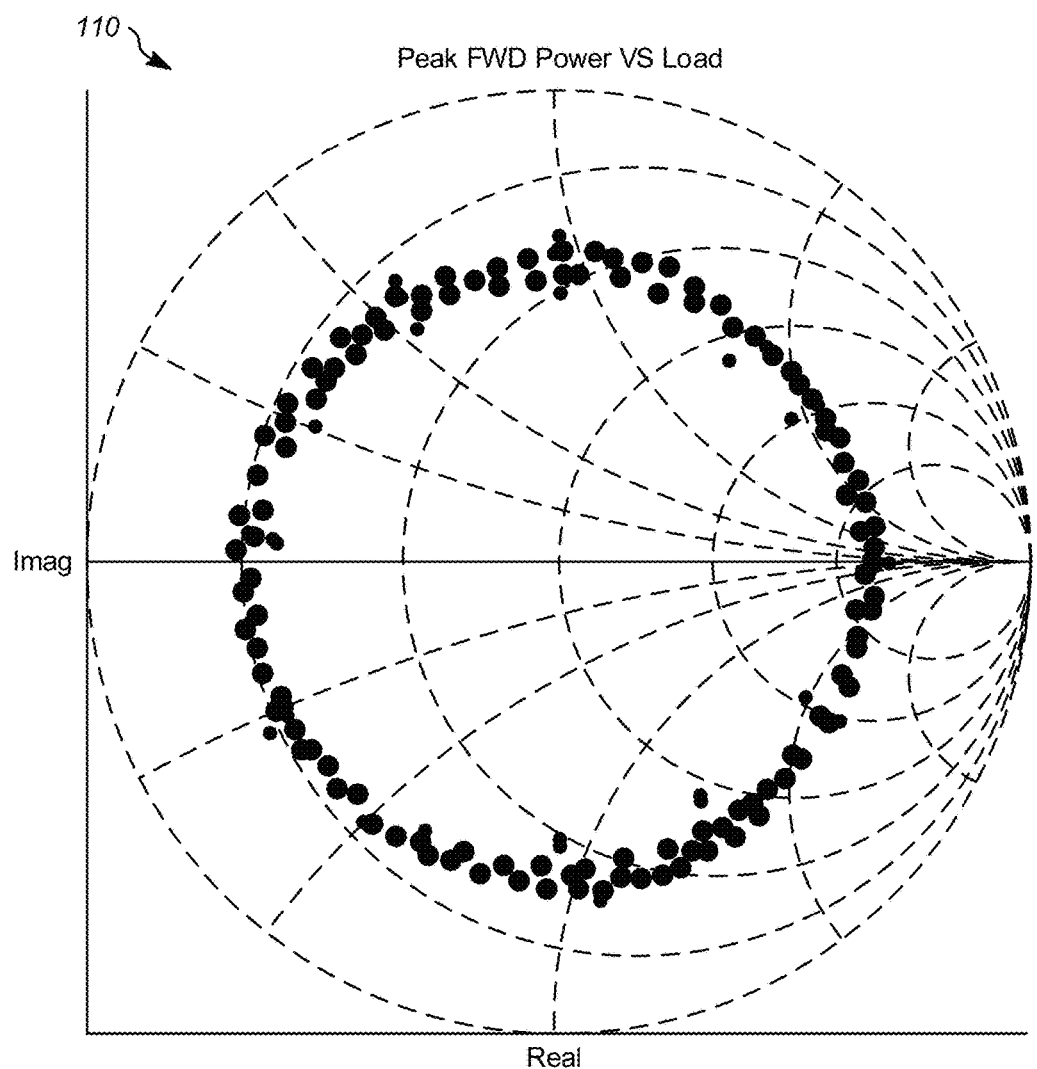
FIG. 9 shows a Smith chart showing the forward power output by an RF generator when operating in a burst mode around the different phases of the Smith chart.

FIG. 9 depicts an exemplary Smith chart demonstrating the applied power relative to the position (i.e., phase) of the signal applied to load 32. As can be seen, in Smith chart 110, a position on the Smith chart corresponds to an impedance, which, in part, determines the power applied to a load. Each plotted point on Smith chart 110 corresponds to a power applied to the load, although the magnitude of the power is not shown in FIG. 9. One skilled in the art will recognize, however, that various regions of plotted points can represent more or less power applied to the load. Thus, for various RF generators, a region of Smith chart 110 may represent an optimum operating region for transferring maximum power to a load. In various implementations, control parameters can be selected so that the RF generator operates in optimum regions and avoids suboptimum regions.

Figure 10:
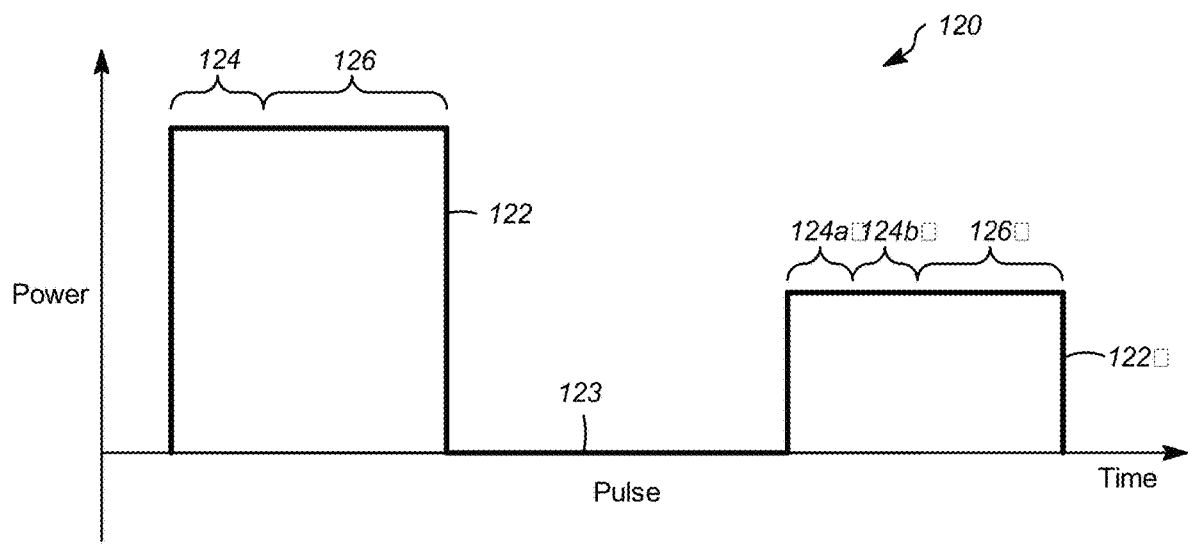
FIG. 10 shows a pulse with the ON time of the pulse divided into states to define modes of operation in accordance with the present disclosure.

FIG. 10 depicts a pulse waveform 120 of a pulsed RF system, similar to FIG. 2. RF waveform 40 of FIG. 2 has been omitted from FIG. 10, but one skilled in the art will recognize that FIG. 10 represents pulses in a pulse implementation of a RF generator system, such as power delivery system 10 of FIG. 1. The ON period or regions 122, 122' of pulse waveform 120 are shown divided into a first section or state 124 including a power burst and frequency-based impedance control and a post burst section or state 126 including matching network impedance control section or state. Pulse waveform 120 also includes an OFF period or region 123.

ON region 122' of pulse waveform 120 shows two impedance control subsections or substates 124a', 124b'. Sections or states 124, 126 may refer to time-based operation or control of RF generator 12 and matching network 18 over an ON region of pulse waveform 120. During each state, various modes of control of RF generator 12 and matching network 18 may be implemented. The ON region 122, 122' of pulse waveform 120 thus indicates at least two states, which may correspond to at least two modes of power delivery and impedance matching in power delivery system 10. A first mode includes frequency-based impedance control occurring during state 124 while applying a power burst. A second mode includes impedance matching network impedance control occurring during state 126 and is implemented by matching network 18 of power delivery system 10. Matching network impedance control tuning elements of matching network 18 are adjusted to provide impedance matching.

In various embodiments, frequency-based impedance matching or tuning in state 124 may be implemented as either automatic frequency tuning (AFT) or dynamic frequency tuning (DFT). AFT/DFT can generally be described as operating within a predetermined range of frequencies to control an impedance match. Examples of automatic frequency tuning and dynamic frequency tuning can be found with respect to U.S. Pat. No. 8,576,013 and U.S. Pat. No. 9,041,471, all assigned to the assignee of the present application and incorporated by reference in this application. In various embodiments, AFT/DFT may provide sufficient impedance control so that power delivered to the load meets the power requirements and no burst power is required.

In various embodiments, frequency-based impedance matching or tuning can be effected using selected operating frequencies to control impedance, as compared to varying a frequency within a predetermined frequency range, as in AFT or DFT. In various other embodiments, frequency-based impedance matching or tuning can be effected by selection of a frequency trajectory in which transition from a start frequency to an end frequency utilizes one or more predetermined intermediate frequencies to optimize the impedance match during the transition. Following state 124, frequency-based tuning may be disabled in state 126, and impedance matching is carried out by matching network 18 using conventional matching network techniques. Such techniques include conventional matching network techniques in which one or plurality of variable reactive elements are adjusted in order to vary the impedance at the output of RF generator 12.

In various embodiments, and merely by way of example, the RF frequency of one or both of RF generators 12 of FIG. 1 may be 13.56 MHz or a multiple thereof. In various other embodiments, a source RF generator can operate at 13.56 MHz or a multiple thereof, and a bias RF generator can operate at or within approximately 2% of 13.56 MHz or a multiple thereof.

In various embodiments, pulse 120 may have a frequency of approximately 100 Hz. When pulse 120 is approximately 100 Hz, state 124 can be approximately 30 µs, but can vary. The duration of state 124 can be adjusted in accordance with various design considerations. In various other embodiments, state 124 need not implement AFT or DFT frequency tuning to achieve a match. In various embodiments, state 124 of pulse 120 can indicate a selected RF frequency different than the frequency at which RF generator 12 operates for a substantial duration of ON region 122. By way of non-limiting example, assuming that in various embodiments RF generator 12 operates at 13.56 MHz, during startup, the frequency output by RF generator 12 in state 124 may be selected automatically by the control system. The control system may select the frequency by using a frequency restore mode in which the frequency is set in accordance frequencies used in similar, prior conditions, or the frequency can be preset to a user selected frequency. One approach to determining an optimal starting frequency includes conducting a frequency sweep at a low or lowest possible power, representative of pulse starting conditions, and record the frequency which leads to lowest reflected power. Further, in various embodiments, frequency-based impedance tuning over state 124 of pulse 120 may be implemented with or without a power burst. That is, frequency tuning can be applied in state 124 coincident with a power burst in which the power output of RF generator is increased by increasing the amplitude of the RF signal for a predetermined time, such as 30 µs. In other embodiments, frequency-based impedance tuning may be implemented without applying a power burst.

Figure 11:
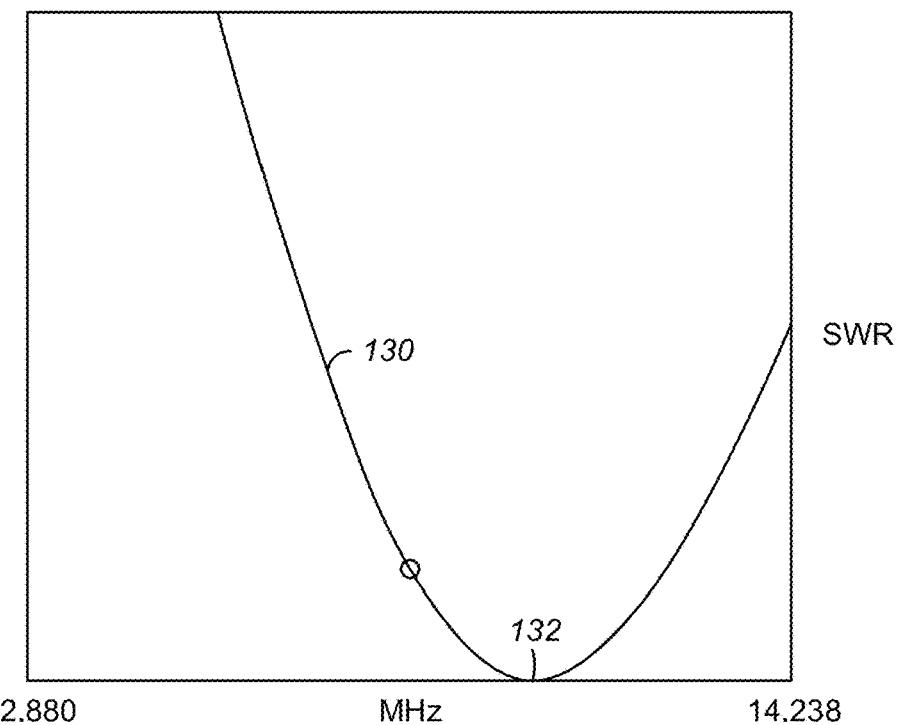
FIG. 11 shows a plot of voltage standing wave ratio versus frequency in accordance with the principles of the present disclosure.
Figure 12:
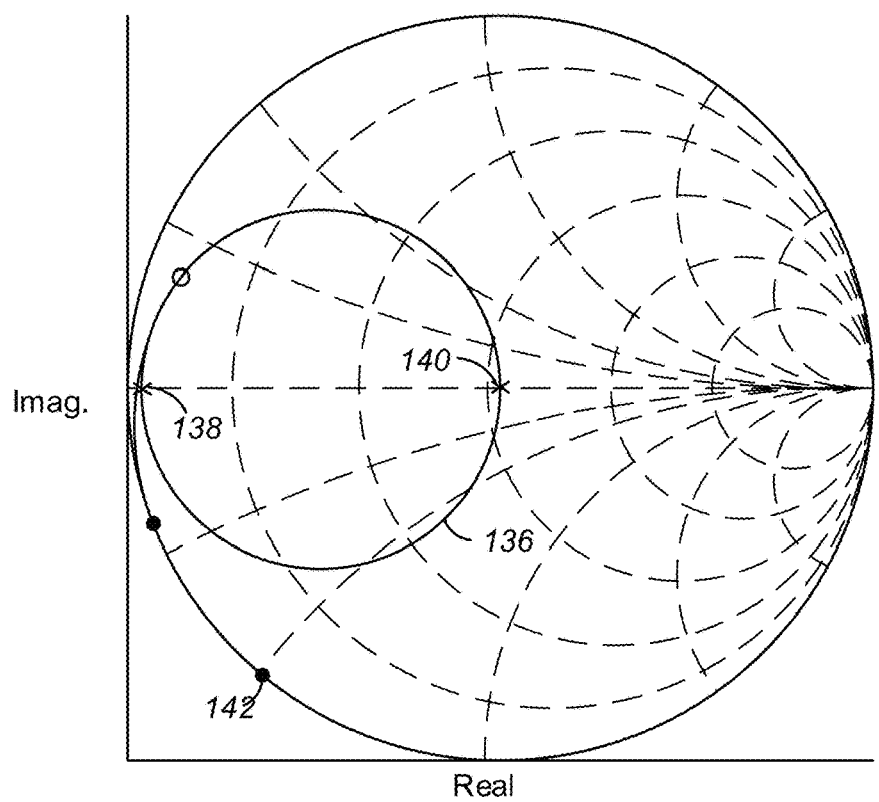
FIG. 12 shows a Smith chart of the impedance relative to the frequency in accordance with the principles of the present disclosure.

FIGS. 11 and 12 depict a plot of the voltage standing wave ratio (VSWR) in FIG. 11 and a Smith chart in FIG. 12. In FIG. 11, the VSWR is shown as a function of frequency. Waveform 130 reaches a minimum at position 132 at a frequency of approximately 13.78 MHz. In FIG. 12, plot 136 depicts variation of phase with respect to frequency starting at position 138 reaching the origin at position 140 and following a trajectory to position 142. Thus, in a sweep from approximately 12.8 MHz to 14.238 MHz, the change in frequency varies the impedance, and the frequency change acts as an actuator for both VSWR, as shown in FIG. 11, and phase, as shown in FIG. 12. Thus, FIGS. 11 and 12 indicate that frequency tuning during state 124 of FIG. 10 provides an improved impedance match between RF generator 12 and load 32.

Figure 13:
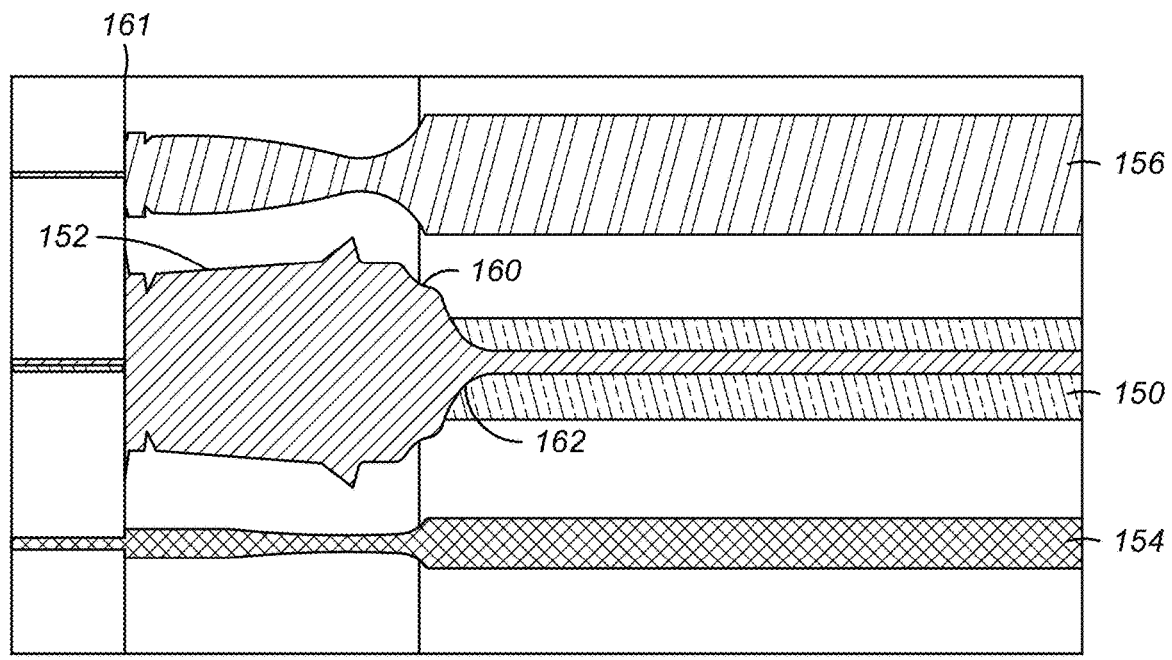
FIG. 13 shows a plot of forward voltage, reverse voltage, and RF generator output voltage versus time for a conventionally configured power delivery system.
Figure 14:
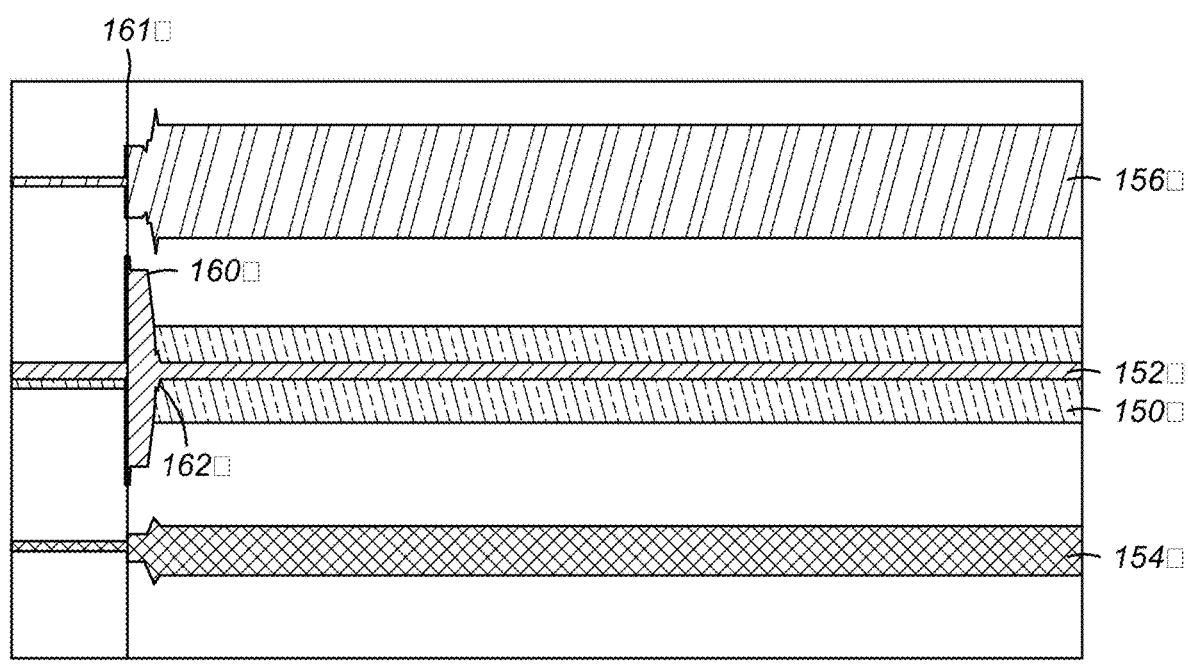
FIG. 14 shows a plot of forward voltage, reverse voltage, and RF generator output voltage versus time for a power delivery system operating in accordance with the principles of the present disclosure.

FIGS. 13 and 14 represent waveforms indicating example results when utilizing conventional matching network impedance control over the entirety of a pulse, such as ON region 122 of FIG. 10, as shown in FIG. 13. FIG. 14 depicts a combined power burst at a burst power and frequency-based impedance control mode such as in state 124 of FIG.

10, followed by a network impedance matching control mode, such as in state 126 of FIG. 10. During state 126, frequency is selected irrespective of the impedance, and in various embodiments, is selected in accordance fabrication process requirement associated with the load. For each figure, the systems are substantially similar, except the implementation of varying modes of impedance matching over multiple states.

In FIG. 13, waveform 150 depicts forward power and waveform 152 depicts reflected power. Waveform 154 depicts voltage, and waveform 156 depicts current. In this various embodiment, forward power waveform 150 and reverse power waveform 152 are measured at the output of an RF generator, such as RF generator 12 of FIG. 1, and voltage waveform 154 and current waveform 156 are measured at the load, such as load 32 of FIG. 1.

As can be seen in FIG. 13, when impedance matching is implemented using only a matching network, such as matching network 18 of FIG. 1, reverse power 152 is approximately equal to the forward power 150 until approximately position 160 at which reverse power 152 diminishes to substantially less than forward power 150 at position 162. FIG. 13 also indicates that voltage 154 and current 156 applied to load 32 are approximately half of the value prior to the start of the attenuation of reverse power 152 at position 160. Following position 162, voltage 154 and current 156 increase to approximately twice as much as the voltage and current prior to position 162. In FIG. 14, the AFT/DFT impedance tuning mode of impedance matching is utilized at the onset of a pulse 161' with no power burst. It should be noted that the quantities referred to in FIG. 13 are referred to similarly in FIG. 14 with the addition of a prime indicator.

In FIG. 14, following the initiation of a pulse at position 161', reverse power 152' starts to diminish at position 160' and reaches a minimum at approximately position 162'. Between positions 160' and 162', it can be seen that in addition to reverse power 152' diminishing, voltage 154' and current 156' increase similarly to FIG. 13, wherein voltage 154' and current 156' increase to at least double the value prior to position 160'. Further, the time between positions 161 and 162 should be noted. In FIG. 14, the time between pulse initiation at position 161' and position 162' represents a substantially shorter time than the time between positions 161 and 162 of FIG. 13. Further, it can also be seen that reverse power 152' attenuates not only sooner, but also over a shorter time, as can be seen with respect to a shorter time period between positions 160' and 162'. In FIG. 13, on the other hand, a greater time period exists between positions 160 and 162.

Further with respect to FIGS. 13 and 14, an auto tuning matching network approach may be implemented, such as by matching network 18 of FIG. 1. In the auto tuning matching network approach, matching network 18 initiates impedance match control upon detection of an RF signal, rather than detection of a pulse. The RF signal appears upon initiation of a pulse. After having detected an RF signal, matching network 18 initiates impedance matching by adjusting reactive elements, such as capacitances and inductances, in matching network 18 to adjust impedance to improve the match between RF generator 12 and the transmission line at the output of matching network 18. After a pulse is no longer detected, matching network 18 remains in its current position, anticipating that the next pulse will require a similar match configuration. Thus, at the completion of the pulse ON period, after which no RF signal is detected, matching network 18 remains in its current position in anticipation that the next RF signal detected will cause adjustment to the approximate present position, thereby presetting matching network 18 for the next detection of an RF signal. Various embodiments use one of several time delays relative to the detection of the RF ON or pulse ON to define the region of the pulse where matching network 18 should tune. In various embodiments, matching network 18 tunes sometime after the burst and sometime before the RF signal or the pulse turns OFF or changes state.

While such an approach may be useful in FIG. 13 in which no burst occurs, when RF generator 12 outputs a power burst such as in state 124, where a greater power is output by RF generator 12 at pulse initiation, the tuning components of matching network 18 may not be in an optimal position to adjust for the increased power in the burst. Upon detection of the higher amplitude RF signal during the power burst, the matching network cannot respond within typical power burst intervals and the power burst is masked so the matching network does not detect the power burst. Because the matching network 18 does not react during the power burst and tunes to the steady state of the pulse ON time, such as at state 126, a significant impedance mismatch is seen by the generator at the instant power comes ON. Matching network 18 requires time to adjust, and the adjustment time results in a less than optimal impedance match during the adjustment. While the burst does provide additional power, it adds complexities to the operation of matching network 18. Using frequency-based tuning for impedance matching relieves matching network 18 from having to adjust during the power burst and facilitates impedance matching following the power burst.

Figure 15:
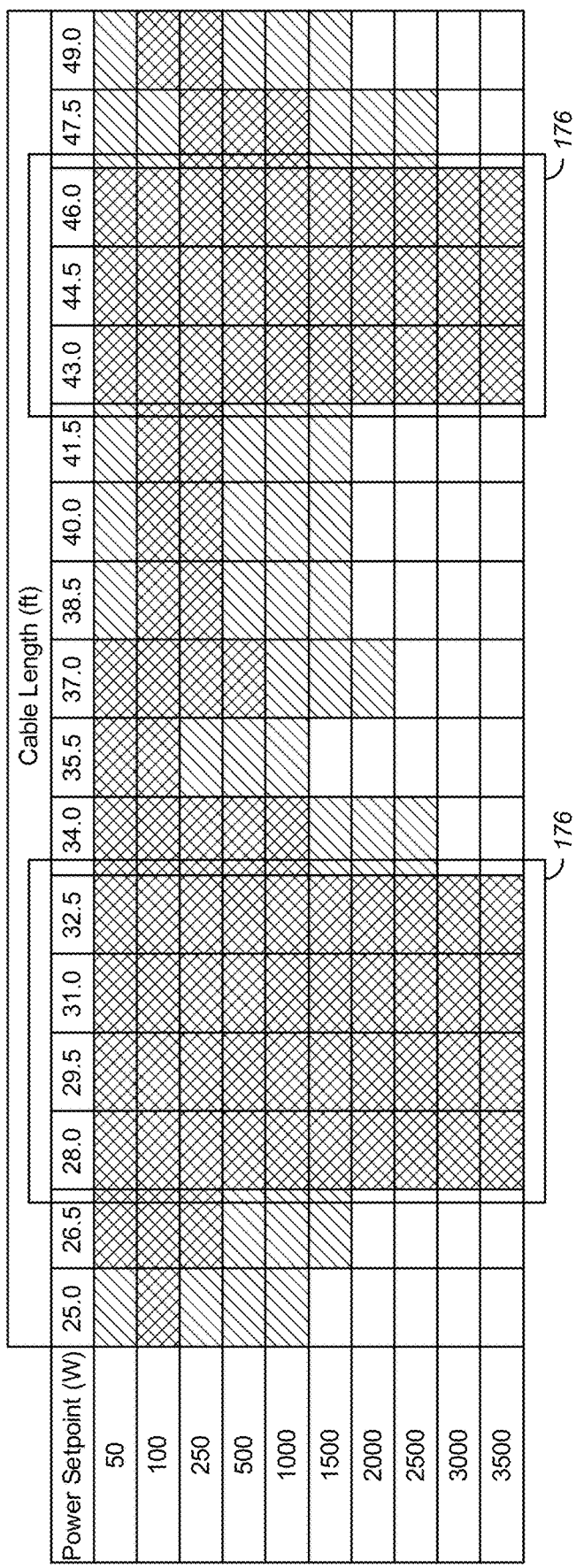
FIG. 15 shows a stability map for a power delivery system operating in accordance with the principles of the present disclosure.

FIG. 15 depicts a stability map of cable length along the horizontal axis and power setpoint along a vertical axis. The stability map of FIG. 15 depicts two regions, a stable region indicated in a first cross-hatching and an unstable region indicated in a second cross-hatching. Stability is determined in accordance with reverse power being greater or less or equal to a predetermined percentage of a pulse. That is, when reverse power is less or equal to a predetermined percentage of the pulse, the sheath is stable. Conversely, when reverse power is greater than a predetermined percentage of the pulse, the sheath is unstable. It is also possible to use a different metric such as reflection coefficient or SWR to generate a similar stability map.

In various configurations, the cable length can be used to indicate a measure of stability of the system. For example, boxes 176 indicate stability of the system over seven cable lengths across multiple power setpoints, with reflected power being less than or equal to a predetermined percentage of the pulse. Outside of boxes 176, each cable length exhibits a reflected power greater than a predetermine percentage of the pulse at one or more power settings for each particular cable length. Further, within boxes 176, not only is there stability across the cable length, but stability exists over multiple cable lengths at multiple powers. The cable lengths within boxes 176 accommodate a multitude of power setpoints. Within boxes 176, the respective three and four cable lengths enable sheath formation at the multiple cable lengths. Thus, one benefit of the multi-state impedance matching, including a first state during which a burst power is output by an RF generator at a frequency to enable impedance matching and a second state during which a matching network mode of impedance matching occurs, provides a stability map having properties as shown in FIG. 15. This improves over conventional matching network based impedance matching. It is desirable to have a broad stable operating window to ensure small unit to unit variations will not shift operation into an unstable region.

Figure 16:
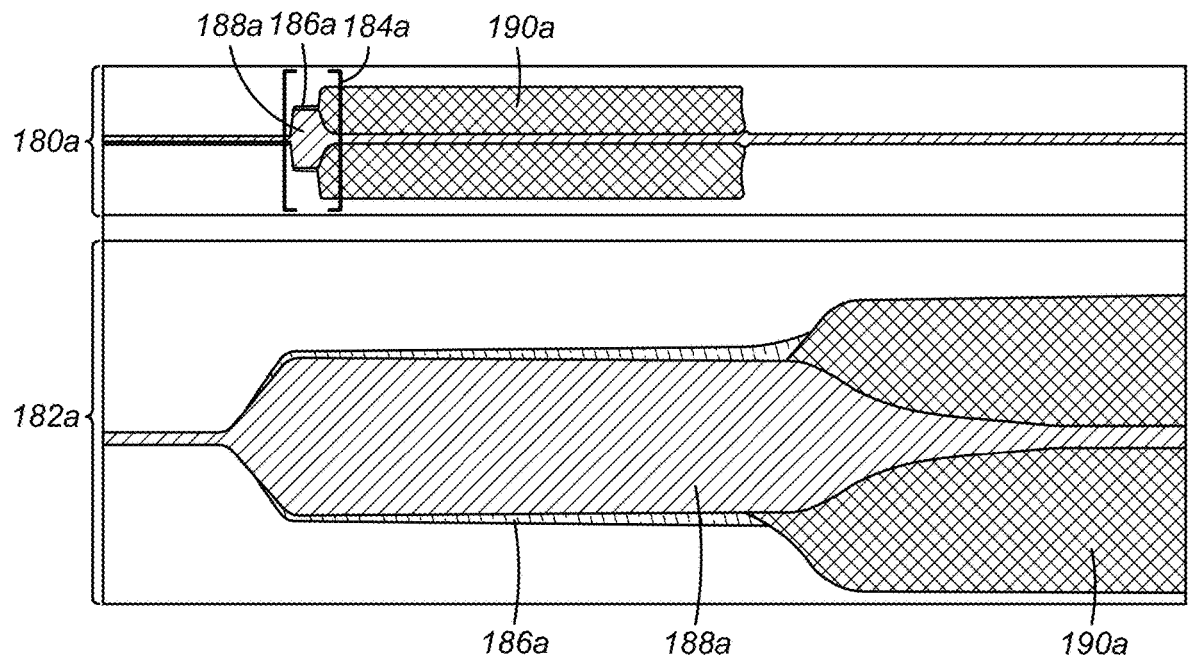
FIG. 16 shows a plot of forward power, reverse power, and voltage output by the RF generator when operated conventionally.

FIGS. 16-25 describe operation of the multi-mode impedance control over multiple states in a power delivery system 10 of FIG. 1 with reference to either of RF generators 12. FIG. 16 depicts waveforms of the output of an RF generator, such as RF generator 12 of FIG. 1. FIG. 16 depicts two views, including a top view 180a at a first time scale and a second view 182a representing an expanded view of bracketed portion 184a. Bottom view 182a represents a 20x expanded view of bracketed section 184a. In FIG. 16, waveform 186a represents forward power, waveform 188a represents reverse power, and waveform 190a represents the voltage measured at the output of a match network 18a or 18b of FIG. 1.

It will be recognized that as described above, delivered power to a load is a quantity represented by the difference between the forward power, such as forward power 186a and reverse power 188a. While delivered power is not shown in FIG. 16, voltage 190a varies in accordance with the delivered power which in turn varies in accordance with a difference between the forward voltage 186a and reverse voltage 188a. Forward power waveform 186a is not shown throughout the entirety of view 182a, as it is overlaid by voltage 190a. However, forward power 186a varies in some proportion to voltage 190a, wherein an increase of voltage 190a is coincident with an increase of forward power 186a and/or a decrease in reverse power 188a.

Figure 17:
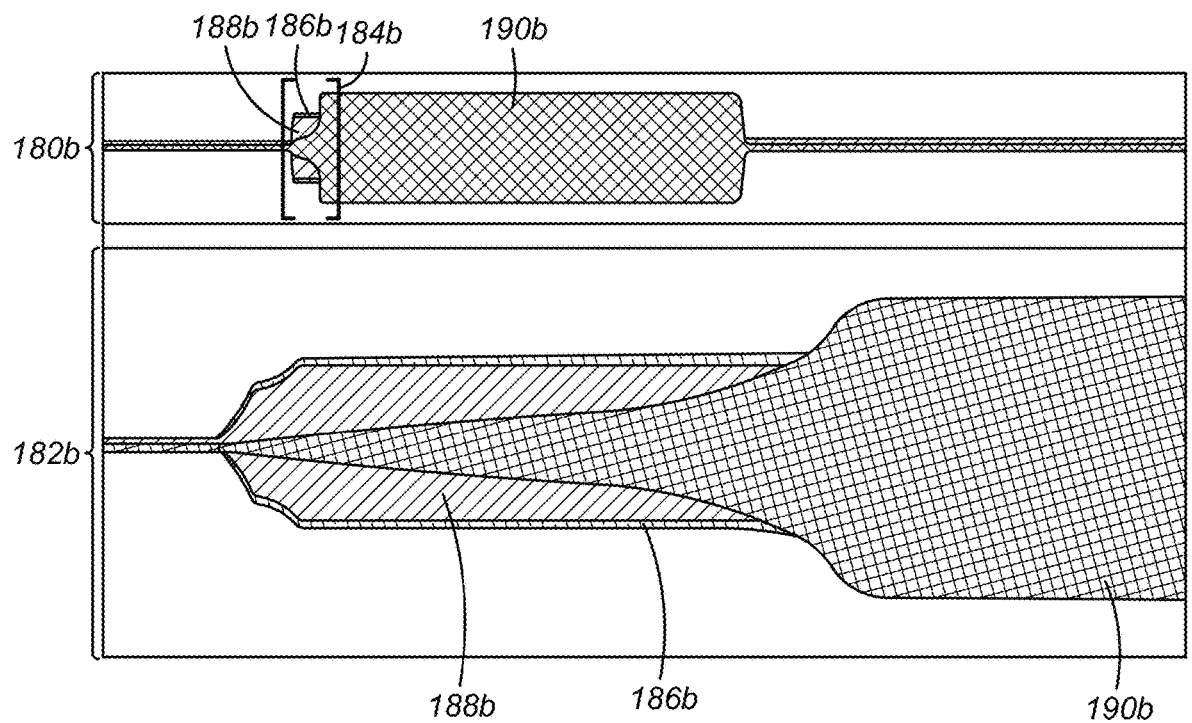
FIG. 17 shows a plot of forward power, reverse power, and voltage output by the RF generator when operating in accordance with the principles of the present disclosure.

FIG. 16 represents a set of baseline measurements of operating an RF generator 12 by pulsing an RF signal. In a control configuration of FIG. 16, impedance matching is controlled via matching network 18, so that no frequency-based impedance matching occurs in FIG. 16. FIG. 17 depicts waveforms similar to FIG. 16 but under different operating conditions than those of FIG. 16. By way of convention, waveforms from FIG. 16 are followed by the suffix "a." Throughout FIGS. 16-23, similar waveforms for each figure will be referred to using the same reference number with a different letter suffix. For example, view 180a refers to the top view of FIG. 16, and view 180b refers to the top view of FIG. 17; and for example, waveform 168a refers to forward power in FIG. 16, and waveform 186b refers to forward power in FIG. 17.

FIG. 17 depicts operation of a system in which frequency-based impedance tuning comprises a first mode in a first state, such as state 124. In a second state, such as state 126, the power at the load is adjusted to a typical operating power and matching network control of impedance comprise a second mode. In various embodiments, during state 126, frequency is selected irrespective of the impedance and may selected in accordance with the fabrication process requirement associated with the load. As can be seen in FIG. 17, voltage 190b increases at roughly the same time and rate as that in FIG. 16. This is an indication that other control parameters are limiting the output power of the generator.

Figure 18:
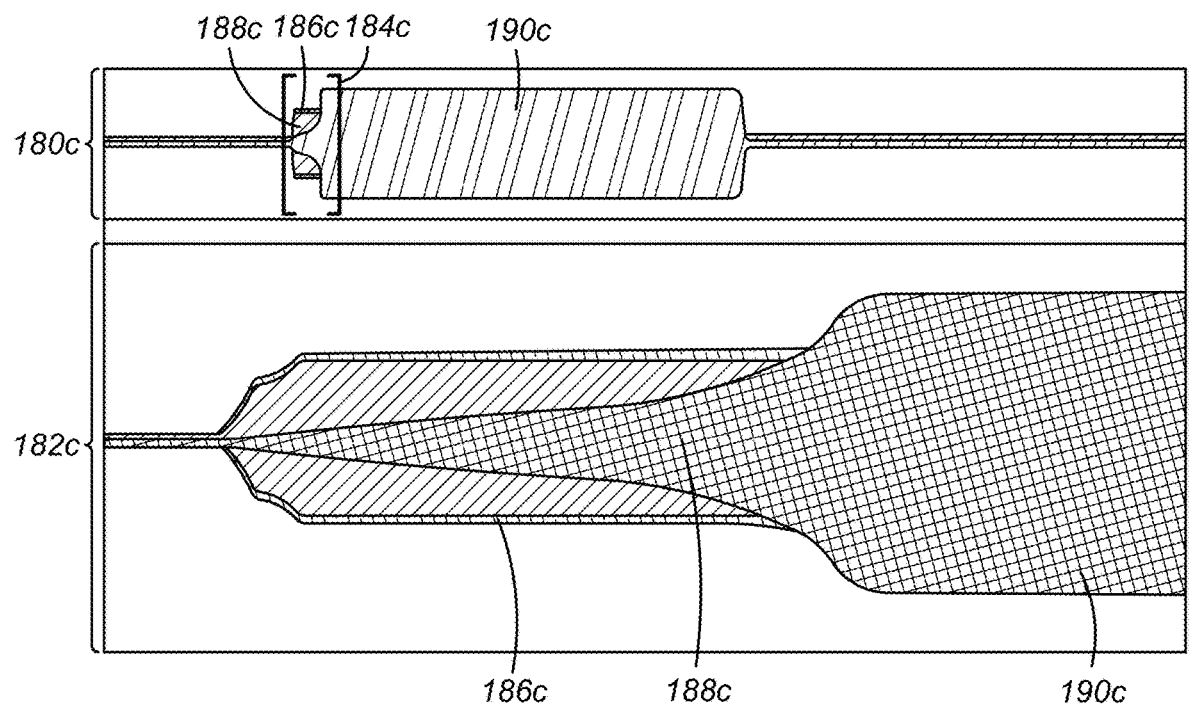
FIG. 18 shows a plot of forward power, reverse power, and voltage output by the RF generator when operating in accordance with the principles of the present disclosure, including applying gamma blanking.

FIG. 18 depicts operation of an RF generator 12a controlled using the mode of the first state of FIG. 17 and further implementing a gamma blanking technique. Gamma (Γ) represents the reflection coefficient of the RF generator 12 of power delivery system 10. In the gamma blanking technique, RF generator 12 operates for a predetermined interval during which increased power is applied without reference to the reflection coefficient of the generator. In a typical application of power by RF generator 12, the reflection coefficient of the Smith chart is used to determine the impedance relative to the phase and is relied upon to limit power. For a predetermined interval time, which is generally a small percentage of the overall pulse width, power is added in the form of a power burst, and the reflection coefficient is not considered when controlling power. When gamma blanking, the RF generator operates in a seudo-open loop to deliver a requested output power during the power burst regardless of the impedance match. The seudo-open loop refers to operation where the RF generator is still operating in a closed loop, in other words, it is still using the data from its sensors to achieve a desired power setpoint, but any limitations that would limit the forward power are ignored. This essentially allows the RF generator to produce equivalent forward power levels as if it was being operated in a true open loop mode. Due to impedance matching, however, power output from the RF generator does not reach the load. Thus, the power delivered to the load is bounded by the pulse, such as shown in FIGS. 2 and 10. During a power burst, however, the pulses of FIGS. 2 and 10 may not define a boundary for the output of the RF generator, but still may define a boundary for the power delivered to the load. The output of the RF generator may be substantially higher than the power delivered to the load because of impedance mismatches. By way of nonlimiting example, blanking may occur for approximately 50 µs of a 1000 µs pulse. FIG. 18 yields similar results to FIG. 17 due to other factors explained further below.

Figure 19:
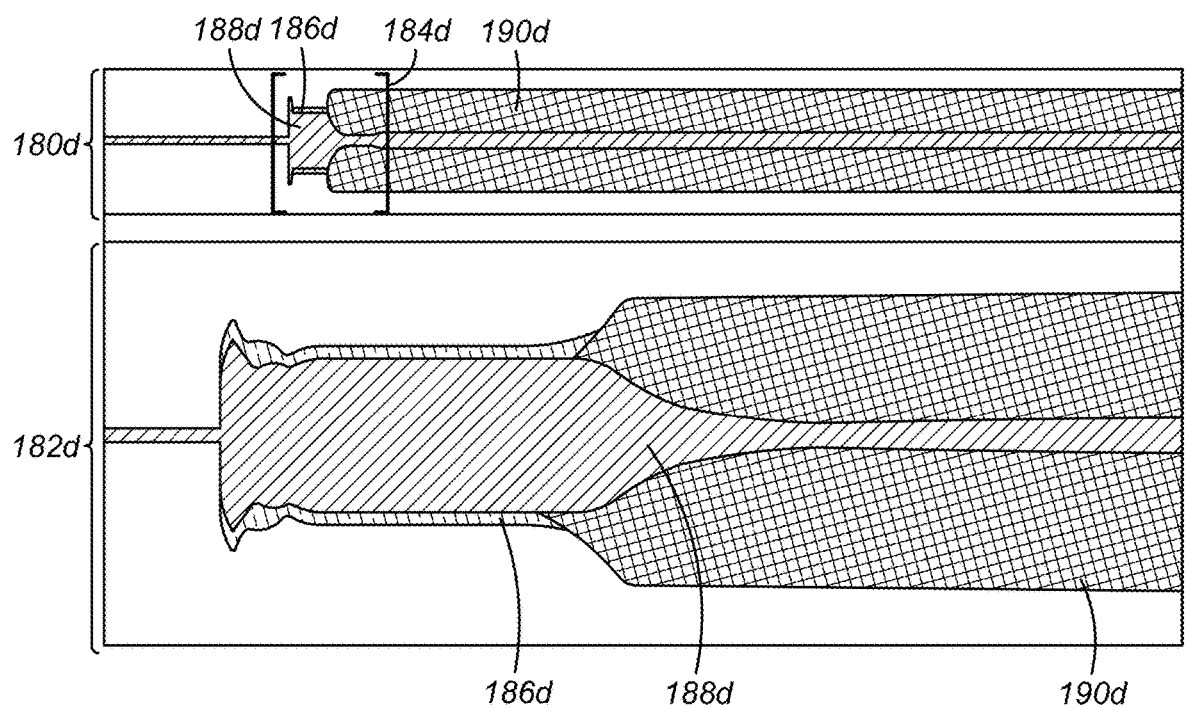
FIG. 19 shows a plot of forward power, reverse power, and voltage output by the RF generator when operating in accordance with the principles of the present disclosure, including applying PID restoration.

FIG. 19 depicts waveforms representing operation of RF generator 12 operated in accordance with FIG. 17 and further including feed forward control based upon prior operation of the RF generator 12. RF generator 12 is controlled in part based upon operation of the generator during prior pulses. In PID restoration, parameters and settings from a prior state are restored if RF generator 12 is set to again operate using parameters and settings from the prior state. Such an approach may be referred to as proportional integral derivative (PID) restoration. Examples of such PID restoration control can be found with respect to U.S. Pat. Nos. 8,952,765, 10,049,857, and 10,217,609, all assigned to the assignee of the present disclosure and incorporated by reference in this application.

As can be seen in FIG. 19, voltage 190d increases in a lesser time relative to pulse initiation, thereby decreasing the time to fully form the plasma sheath. Thus, the combination of frequency tuning based impedance control and feed forward control in a first state, such as state 124, further improves the time to sheath formation relative to the pulse initiation. Although the feed forward approach is described herein as PID restoration control, various feedforward or feedback control mechanisms can accelerate formation of the sheath and are equally applicable herein.

Figure 20:
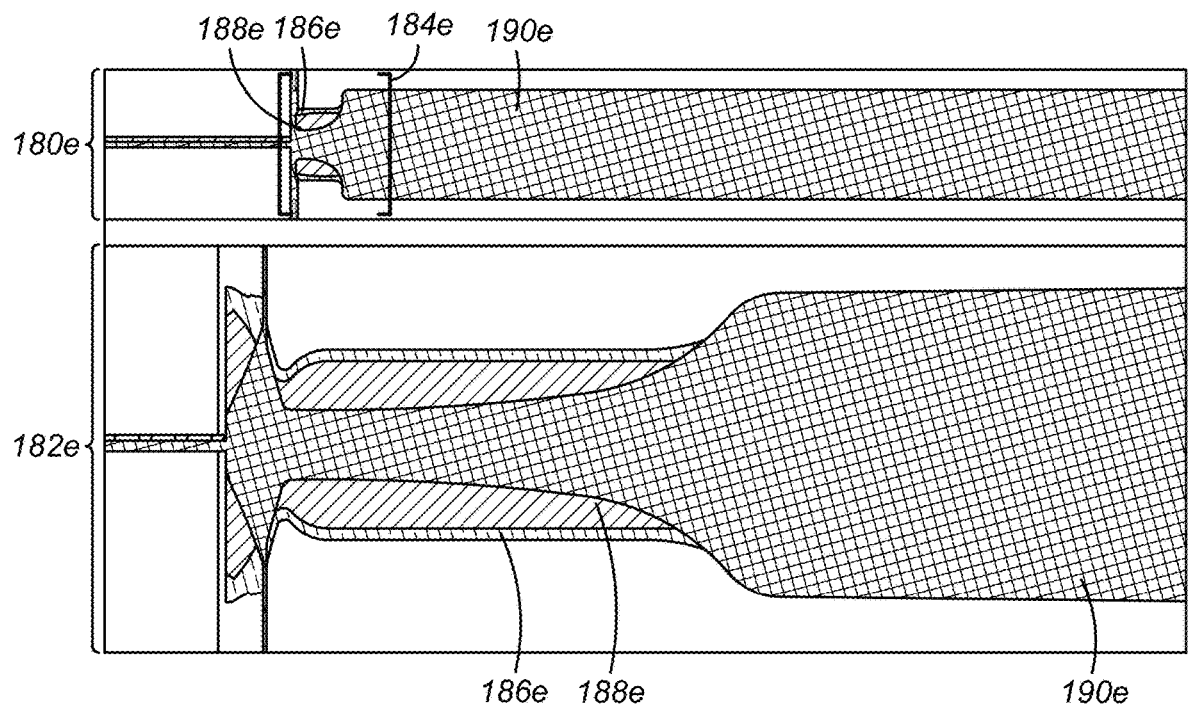
FIG. 20 shows a plot of forward power, reverse power, and voltage output by the RF generator when operating in accordance with the principles of the present disclosure, including applying gamma blanking and PID restoration.

FIG. 20 depicts waveforms representing operation of RF generator 12 as operated in accordance with FIG. 19 and further including gamma blanking as described in FIG. 18. Thus, the combination of burst power, frequency-based impedance tuning, PID restoration, and gamma blanking further improves the time to sheath formation relative to the pulse initiation. FIG. 20 provides for improved sheath formation times, but also results in partial sheath collapse, as suggested by sag in voltage 190e.

Figure 21:
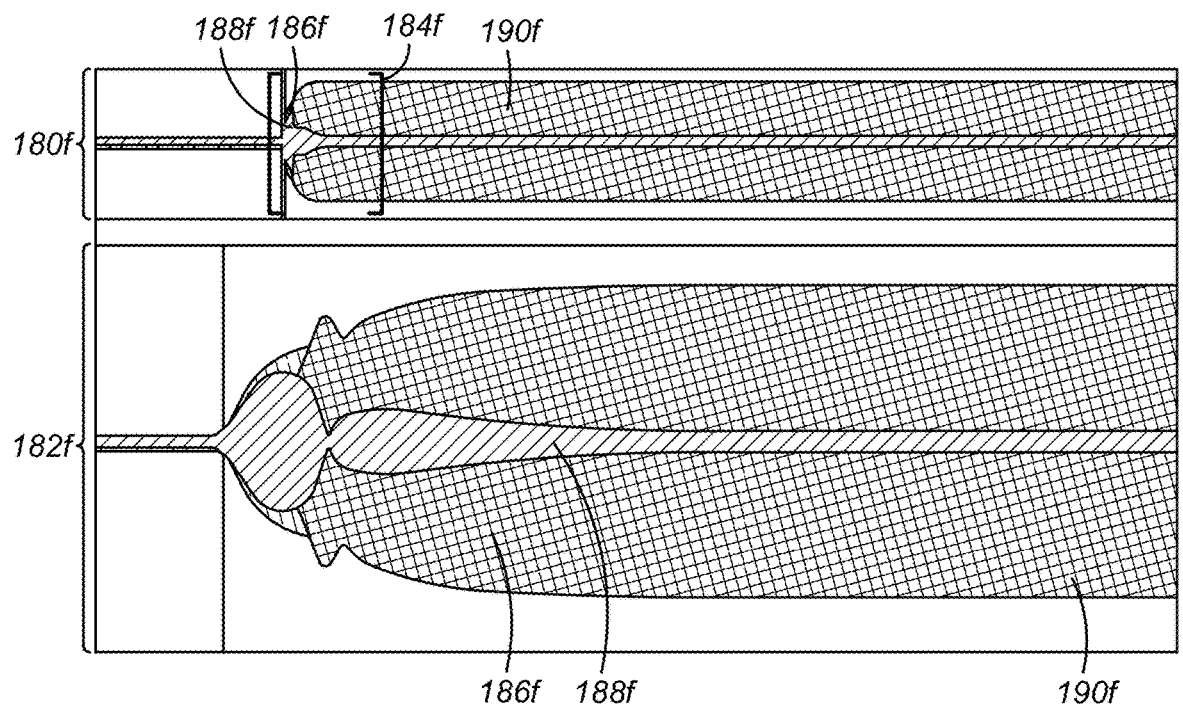
FIG. 21 shows a plot of forward power, reverse power, and voltage output by the RF generator when operating in accordance with the principles of the present disclosure, including applying frequency-based impedance tuning to two differing, sequential startup frequencies.

FIG. 21 depicts waveforms describing operation of RF generator 12 in which in a first state, RF generator 12 applies a power burst and operates at a first frequency for a short duration at startup to provide frequency-based impedance tuning over the first state. In a second state following the first initial state, RF generator 12 is operated at a second frequency to provide frequency-based impedance tuning in the second state. Substates 124a' and 124b' of FIG. 10 provide examples of the respective first and second states. Control then transitions to matching network based impedance tuning using matching network 18, such as at state 126' of FIG. 10. As can be seen in FIG. 21, the plasma sheath builds up shortly after pulse initiation during startup. In other embodiments, frequency-based impedance tuning, such as DFT may be enabled for both states 124a' and 124b'. This approach smooths transitions between states to sustain the power coupling to the load. The frequency during 124b' may be fixed. Various other approaches may apply a variable power over a frequency ramp in state 124b'. This allows the control system to vary the power setpoint and frequency from state 124a' values to the desired state 124b' values over a short time period. Thus, using a power burst and frequency based impedance tuning to adjust states 124a', 124b' enables the sheath to form in a shorter time period as indicated by waveform 190f.

Figure 22:
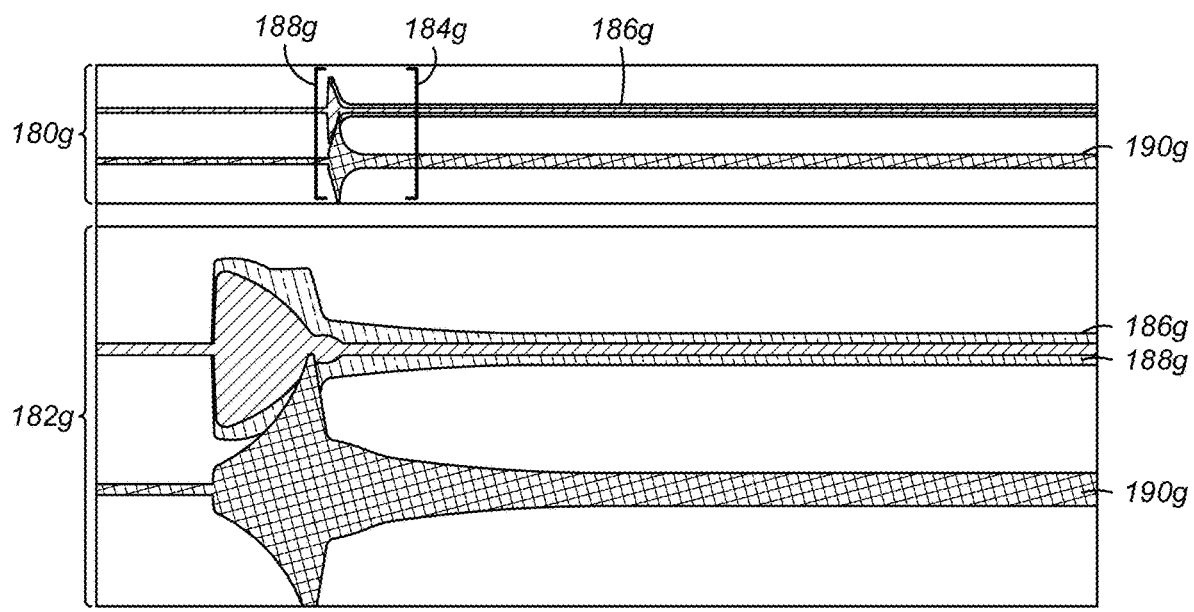
FIG. 22 shows a plot of forward power, reverse power, and voltage output by the RF generator when operating at a first power setpoint in accordance with the principles of the present disclosure, including applying frequency-based impedance tuning to two differing, sequential startup frequencies, PID restoration, gamma blanking, and power ramping between the different frequencies.
Figure 23:
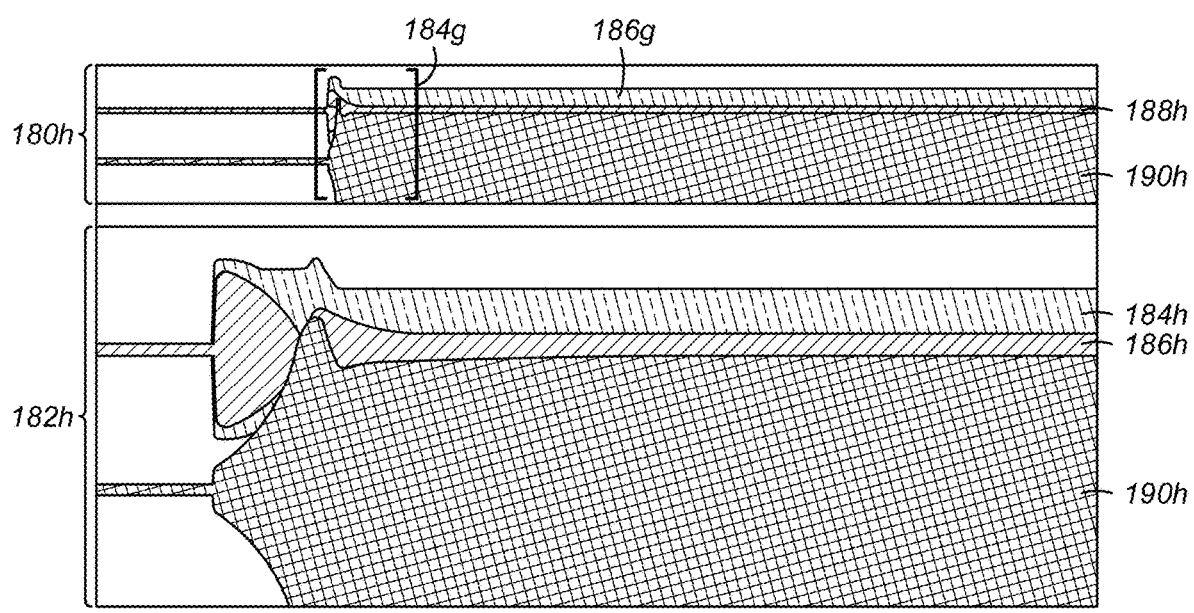
FIG. 23 shows a plot of forward power, reverse power, and voltage output by the RF generator when operating at a second power setpoint in accordance with the principles of the present disclosure, including applying frequency-based impedance tuning to two differing, sequential startup frequencies, PID restoration, gamma blanking, and power ramping between the different frequencies.

FIGS. 22 and 23 depict waveforms describing operation of RF generator applying a power burst and operating at a first startup frequency of the RF signal at the initiation of a pulse, during which frequency-based impedance tuning is employed (state 124a'), followed by applying a power burst and operating at a second frequency, during which frequency-based impedance tuning is employed (state 124b'). PID restoration is applied along with gamma blanking. Further, power is ramped down when changing the frequency from the first frequency of state 1 to the second frequency of state 2. The distinction between FIGS. 22 and 23 is that FIG. 22 depicts operation of an RF generator 12 at a lower power setpoint, and FIG. 23 shows operation of RF generator 12 at a higher power setpoint, wherein the higher setpoint is approximately 50 times the lower set point. In each of FIGS. 22 and 23, the combination of power burst and a first startup frequency (state 1) at pulse initiation and power burst followed by a second startup frequency (state 2), thus utilizes frequency-based impedance tuning in each state, in combination with PID restoration control, gamma banking, and power ramping provides sheath formation with minimal delay. In various other approaches, states 1 and 2 need not fix the frequency for each state, but may ramp the frequency from state 1 to state 2, as compared to an abrupt change from a first frequency to a second frequency.

Figure 24:
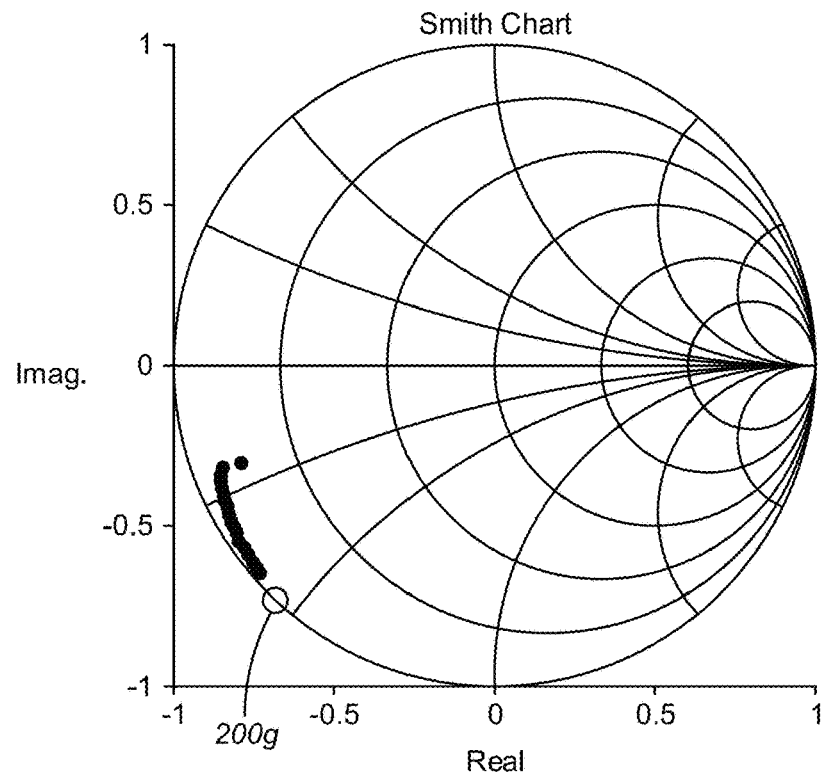
FIG. 24 is a Smith chart showing an impedance trajectory measured at the load from pulse initiation to steady state for a power delivery system arranged in accordance with the principles of the present disclosure.
Figure 25:
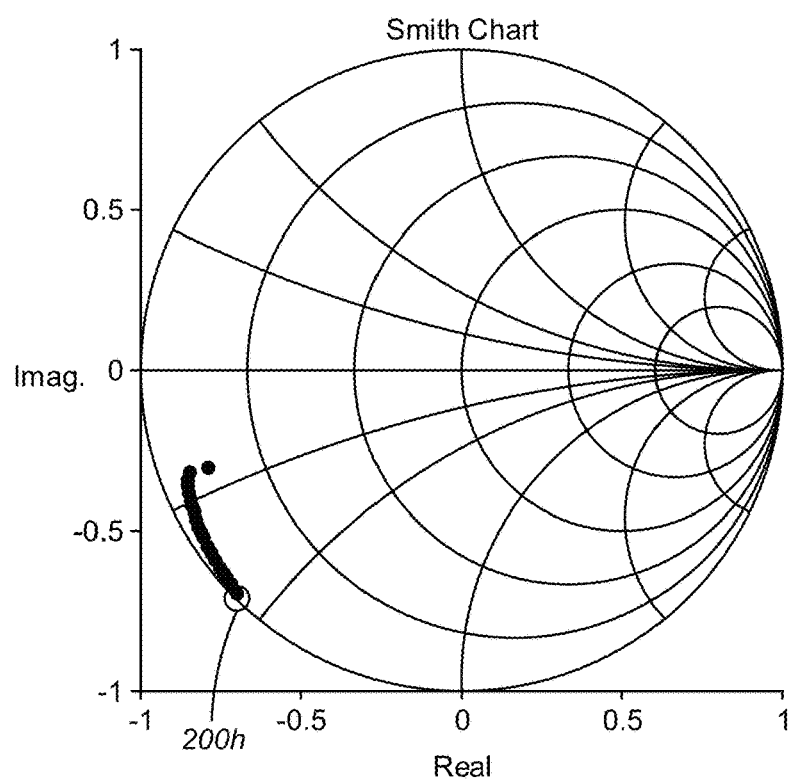
FIG. 25 is a Smith chart showing an impedance trajectory measured at the load from pulse initiation to steady state for a power delivery system arranged in accordance with the principles of the present disclosure.

FIGS. 24 and 25 correspond to respective FIGS. 22 and 23 and are Smith charts of the respective trajectories of the impedance from pulse strike, or the initiation of the pulse, to pulse steady state based on parameters detected at the load or plasma chamber. As can be seen in the Smith charts, the trajectories are similar and tend toward the plasma off chamber impedance shown in the Smith chart by respective circles 200g and 200h. Thus, as can be seen from FIGS. 24 and 25, control as applied in FIGS. 23 and 24 provides similar trajectories regardless of the power set point.

Figure 26:
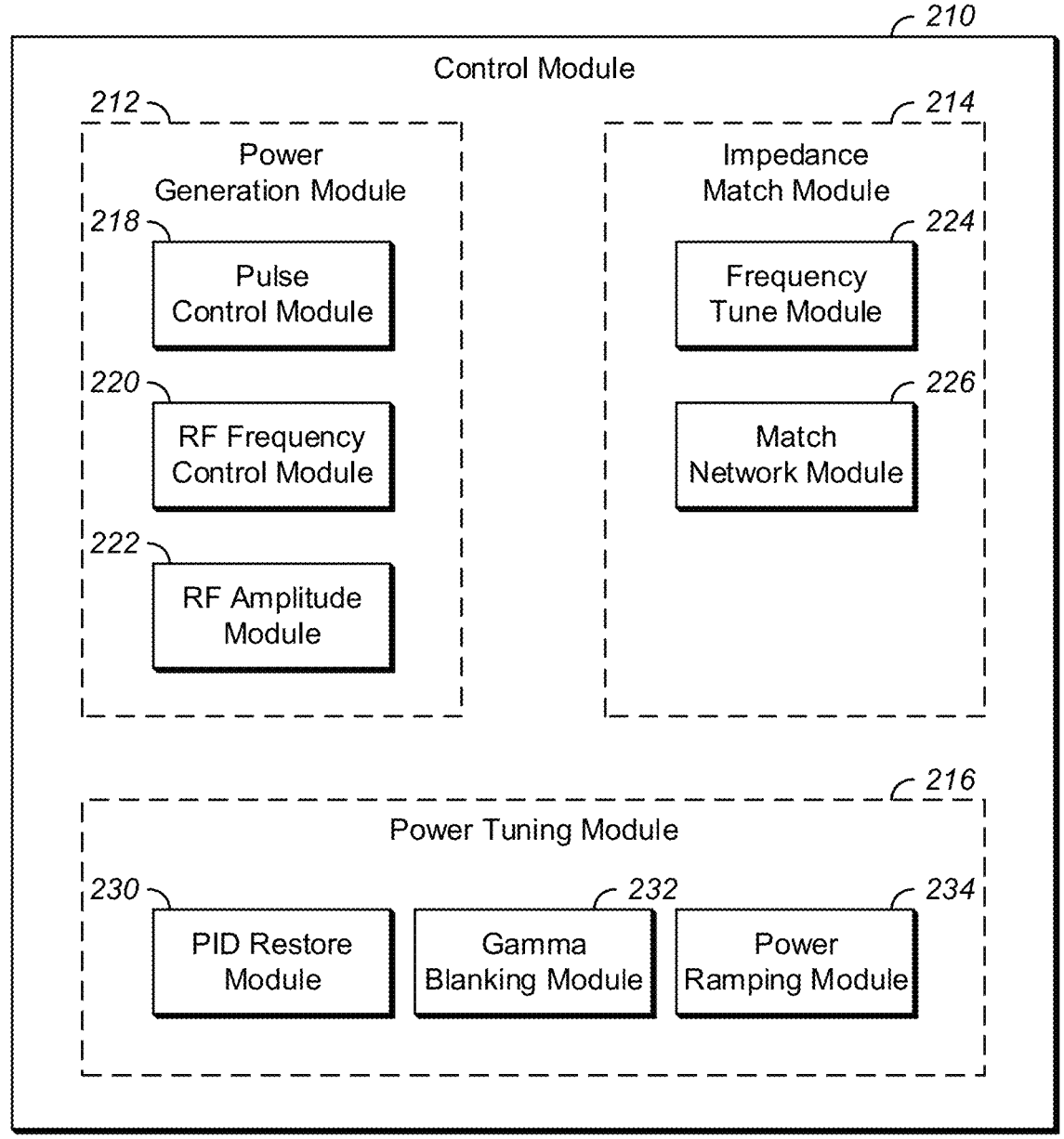
FIG. 26 depicts a functional block diagram of an example control module arranged in accordance with various embodiments.

FIG. 26 shows a control module 210. Control module 210 incorporates various components of FIG. 1. Control module 210 may include power generation control module section 212, impedance match module section 214, and power tuning module section 216. Power generation module section 212 includes pulse control module 218, RF frequency control module 220, and RF amplitude module 222. Impedance match module section 214 includes frequency tune module 224 and matching network module 226. Power tuning module section 216 includes PID restore module 230, gamma blanking module 232, and power ramping module 234. In various embodiments, control module 170 includes one or a plurality of processors that execute code associated with the module sections or modules 210, 212, 214, 216, 218, 220, 222, 224, 226, 230, 232, and 234. Operation of the module sections or modules 210, 212, 214, 216, 218, 220, 222, 224, 226, 230, 232, and 234 is described below with respect to the method of FIG. 26.

For further defined structure of controllers 20a, 20b, and 20' of FIG. 1, see the below provided flow chart of FIG. 27 and the below provided definition for the term "module". The systems disclosed herein may be operated using numerous methods, examples, and various control system methods of which are illustrated in FIG. 26. Although the following operations are primarily described with respect to the implementations of FIG. 1, the operations may be easily modified to apply to other implementations of the present disclosure. The operations may be iteratively performed. Although the following operations are shown and primarily described as being performed sequentially, one or more of the following operations may be performed while one or more of the other operations are being performed.

Figure 27:
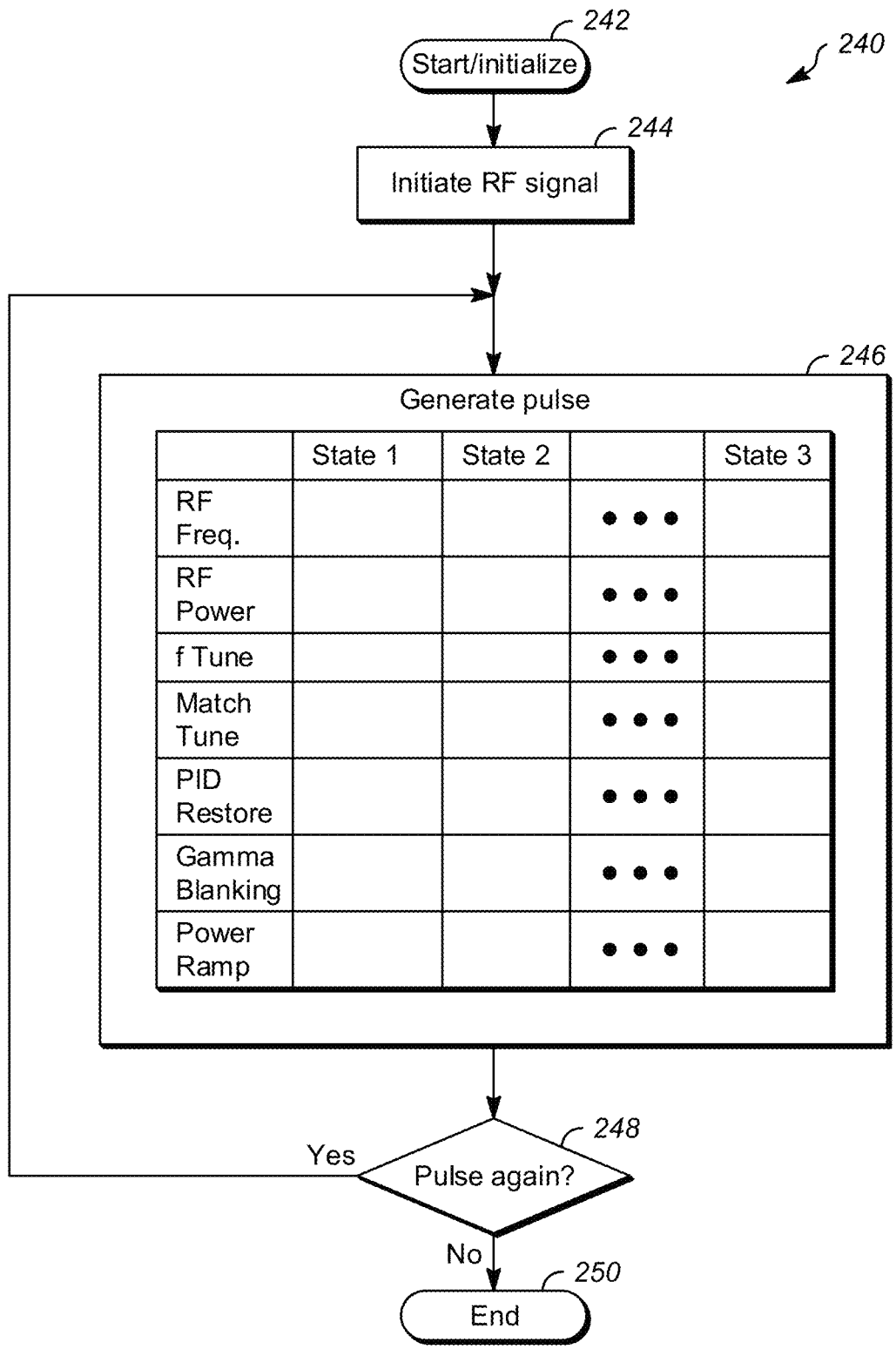
FIG. 27 depicts a flow chart of operation of a control system arranged in accordance with the principals of the present disclosure.

FIG. 27 shows a flow chart of a control system 240 for performing state/mode-based impedance control for, for example, the power delivery systems of FIG. 1. Control begins at block 242, where initialization occurs. Control proceeds to block 244 where the RF signal, such as a 13.56 MHz signal, is initiated. Control proceeds to block 246 in which a pulse is generated to modulate the RF signal initiated at block 244. As can be seen in block 246, pulse generation can involve several parameters, as described above in FIGS. 1-25. As also showing at block 244, the pulse can be divided into a plurality of states in which a number of parameters can be set for each state. The parameters include, but are not limited to, RF frequency, RF amplitude/power, frequency tuning parameters for impedance control, impedance matching network parameters for matching network impedance control, PID restoration, gamma blanking, and power ramping. Control then proceeds to block 248 where it is determined if another pulse should be initiated. If so, control proceeds back to block 246. If not, control proceeds to block 250 where control terminates.

Figure 28:
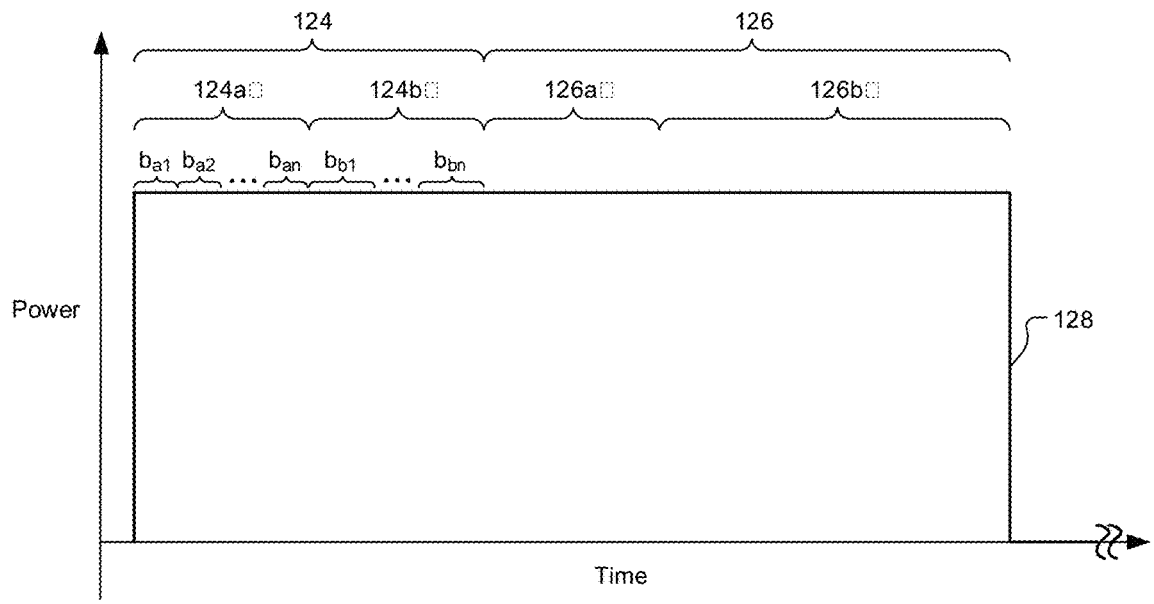
FIG. 28 depicts an expanded view of a pulse with an ON period of the pulse divided into states to define modes of operation in accordance with the present disclosure.

FIG. 28 depicts an expanded view of an ON period or region of a pulse, such as 122 or 122' of pulse waveform 120 of FIG. 10, which will be referred to as pulse region 128. As described above with respect to FIG. 10, waveform 120 has an ON region 122, 122' and an OFF region 123. ON region of 122 of pulse waveform 120 includes first section or state 124 and a second section or state 126. As described in FIG. 10, pulse 122' has a first subsection or substrate 124a', a second subsection or substate 124b', and a third subsection or substate 126'. Substates 124a', 124b' represent subsections or substates of state 124. Substates 124a', 124b' can be used to delineate different modes of operation, where such modes can include various output parameters of an RF generator, including, but not limited to, RF frequency, RF amplitude, phase, and other parameters as described herein.

In various embodiments, substates 124a', 124b' can represent a first substate 124a' in which the RF generator outputs a power burst at a selected frequency, and a second substate 124b' in which the RF generator operates in a transition mode between first substate 124a' and state 126. In various embodiments, state 126 can further define operational modes of an RF generator. In substate 124b', an RF generator may output the same or different power burst and frequency as state 124a'. In various embodiments, state 126 can represent a steady state following a burst mode of operation defined by state 124. Thus, state 126 can represent a steady state of operational mode following a burst mode of operation occurring at-state 124. In various other embodiments, state 126 can include various subdivisions, such as substate 126a' and substate 126b'. Substate 126a' can coincide with a transitional mode of operation between burst mode of operation 124 and a steady or working mode of operation at substate 126b'. In various other embodiments, substate 126a' and substate 126b' may be combined to a single state represented by state 126. Likewise, substate 124a' and substate 124b' may be combined to define a single section or state 124.

Substate 124a' and substate 124b' can be further subdivided into a plurality bins $b_x$, where x generically denotes any bin of the plurality. As shown in FIG. 28, substate 124a' is subdivided into bins, such as bins $b_{a1}$, $b_{a2}$, ..., $b_{an}$. Similarly, substate 124b' can be subdivided into bins $b_{b1}$, $b_{b2}$, ..., $b_{bn}$. In various embodiments, both the width and the number of bins can vary so that the width of each bin within substate 124a' may be the same width or varying width. Likewise, the width and number of bins of substate 124b' may be the same width or different width. Further, the number of bins that comprise substate 124a' and the number of bins that comprise substate 124b' can vary, and the number of bins of any state or substate between pulses can vary. Further, substates 126a' and substates 126b' can be subdivided into bins as described above with respect to 124a', 124b', 124.

In various embodiments, any or one of bins $b_x$, substates 124a', 124b' or state 124 can define various modes of operation, in which various RF system control parameters can be varied. Such parameters can include frequency, amplitude, and phase of the RF signal output by the RF generator, such as RF generator 12 of FIG. 1, match network control parameters, and other control parameters. In various embodiments, the width of a bin may be selected so that a minimum width of a bin corresponds to a maximum control loop rate of the RF generator. The frequency or frequencies output within a bin may be updated from pulse to pulse, since updating frequencies within a bin within the same pulse may be constrained by control loop rates. Thus, in various embodiments, frequency control within a bin is a feed forward control, and the feed forward values within a bin are updated based on measurements taken over one or more prior pulses for corresponding bins.

The modes of operation associated with each state can define, for example, the frequency of the RF signal output by RF generator 12. Accordingly, each bin $b_x$ can define a particular frequency or multiple frequencies of the RF signal output by RF generator 12. The defined frequency can be selected to vary the impedance match between the RF generator 12 and the load 32 to control power delivered to the load. For example, when state 124a defines a mode in which the RF generator 12 outputs a power burst, each bin $b_{a1}$, $b_{a2}$, ..., $b_{an}$ can be assigned a particular frequency, selected in order to adjust the impedance match between the RF generator 12 and load 32 to control power delivered to load 32. Further, in various embodiments, state 124 or substates 124a', 124b' can define a mode of operation of a matching network, such as matching network 18. By way of nonlimiting example, during state 124, it may be desirable to inhibit operation of matching network 18, as described above, while controlling the RF generator to output a selected power at a selected frequency as defined by modes associated with each bin $b_{a1}$, $b_{a2}$, ..., $b_{an}$.

In various modes of operation, the RF frequency output by RF generator 12 during state 124b' may be similarly divided into bins $b_{b1}$, ... $b_{b2}$, ..., $b_{bn}$. During state 124b', particular modes of operation can similarly inhibit operation of matching network 18 as similarly described with respect to substate 124a'. Further, as described above, states 124a', 124b' can be combined to define a single state 124. With a single state 124, state 124 can be subdivided into bins $b_x$, and electrical parameters, described above, can be controlled in order to vary the impedance match between RF generator 12 and load 32 to improve power delivery to load 32. As also described above, during state 124, operation of matching network 18 may be inhibited so that impedance matching substantially varied in accordance with the frequency of the RF signal output by RF generator 12.

With reference to Tables 1 and 2 below, Tables 1 and 2 show a relationship between states of operation and modes. Table 1 addresses a system configured so that pulse 128 of FIG. 28 includes a state 124 during which the RF generator outputs a power burst at a selected frequency and a working state 126 where the RF generator outputs a working power and a greater or nominal frequency. Table 1 further addresses a system in which states 124, 126 are not further subdivided via substates 124' or 126' and, therefore, state 124 is divided into bins $b_{b1}$, $b_{b2}$, ..., $b_{bn}$. As shown in Table 1, during state 124, the RF generator outputs a power burst and frequency is varied over frequencies $f_1$, $f_2$, ..., $f_x$, ..., $f_n$ over successive bins of state 124. A frequency $f_x$ in Tables 1 and 2 can represent one or a plurality of frequencies within a state or bin. Table 1 also indicates that the control actuators for a mode can include frequency, power, and matching network impedance control. In various embodiments, power or power value $P_B$ can be varied from bin to bin over state 124 or can be maintained constant from bin to bin. A power value $P_B$ in Tables 1 and 2 can represent one or a plurality of power values within a state or bin. In state 124, the matching network is disabled, such as by gamma blanking, so that impedance matching occurs through the selection of the frequency in each respective bin.

Table 2 shows states and modes of a RF control in which state 124 is subdivided into substates 124a', 124b', which are further subdivided into respective bins as shown in Table 2. In Table 2, the frequency output by RF generator 12 can vary in accordance with the mode of operation. For example, during substate 124a', the frequency varies by bin, while the power is maintained constant at $P_B$, or burst power. Table 2 also indicates that substate 126a is configured as a transition state in which a transition frequency $f_t$ and a transition power $P_t$ are output by RF generator 12. Burst power $P_B$ can vary from bin to bin and state to state as described above.

TABLE 1

| | States | | | Modes | |
|---|---|---|---|---|---|
| Title | State | Bin | Freq. | Power | Matching Network |
| Burst | 124 | $b_1$ | $f_1$ | $P_B$ | OFF |
| Burst | 124 | $b_2$ | $f_2$ | $P_B$ | OFF |
| Burst | 124 | ... | $f_x$ | $P_B$ | OFF |
| Burst | 124 | $b_n$ | $f_n$ | $P_B$ | OFF |
| Working | 126 | | $f_c$ | $P_W$ | ON |

TABLE 2

| | States | | | | Modes | |
|---|---|---|---|---|---|---|
| Title | State | Substate | Bin | Freq. | Power | Matching Network |
| Burst | 124 | 124a' | $b_{a1}$ | $f_{a1}$ | $P_B$ | OFF |
| Burst | 124 | 124a' | $b_{a2}$ | $f_{a2}$ | $P_B$ | OFF |
| Burst | 124 | 124a' | ... | $f_{ax}$ | $P_B$ | OFF |

TABLE 2-continued

| States | | | | Modes | | Matching |
|---|---|---|---|---|---|---|
| Title | State | Substate | Bin | Freq. | Power | Network |
| Burst | 124 | 124a' | $b_{an}$ | $f_{an}$ | $P_B$ | OFF |
| Burst | 124 | 124b' | $b_{b1}$ | $f_{b1}$ | $P_B$ | OFF |
| Burst | 124 | 124b' | $b_{b2}$ | $f_{b2}$ | $P_B$ | OFF |
| Burst | 124 | 124b' | ... | $f_{bx}$ | $P_B$ | OFF |
| Burst | 124 | 124b' | $b_{bn}$ | $f_{bn}$ | $P_B$ | OFF |
| Transition | 126 | 126a | | $f_t$ | $P_T$ | ON |
| Working | 126 | 126b | | $f_c$ | $P_W$ | ON |

In various embodiments, each state can be named accordingly and each parameter corresponding to each mode can be varied within a particular state, substate, or bin, so that varying modes of frequency, power, and matching network control can be applied across each state. In various embodiments, both frequency-based impedance control and matching network-based impedance control may be active in various pulse states. In such an implementation, frequency-based impedance control is implemented to settle to a nominal value within a short time of an allotted pulse state. The expected tuning time, with the addition of some buffer time, is then used as an OFF period for the matching network. Such a configuration enables the matching network 18 to sense a steady frequency once it is activated, therefore alleviating the need for the matching network to hunt as the frequency settles. In various embodiments, matching network 18 also incorporates frequency tracking capability.

In various embodiments, the reaction of the load impedance can be measured in order to tune the frequencies assigned to each bin or state so that the selected RF frequency for a given bin can be tuned to further minimize impedance variation and maximize power delivery. The frequency or power values may be updated for one or all states, substates, and bins based on power delivery or impedance match conditions. Future states output the adjusted frequency and power values that are determined based on prior outcomes for prior frequency or power values. That is, the values of bins $bx_1^{n+1}, bx_2^{n+1}, \ldots, bx_n^{n+1}$ may be determined in accordance with measurements of the electrical parameters in response to the application of the values of $bx_1^n, bx_2^n, \ldots, bx_n^n$, where n is a time interval. Further, the updating of bins $bx_1^{n+1}, bx_2^{n+1}, \ldots, bx_n^{n+1}$ may be based on one or more prior system reactions to n, n-1, ..., n-m intervals. Thus, the presetting of parameters of the RF generator enables adaptive, feed forward control, which alleviates control loop bandwidth concerns.

Figure 29:
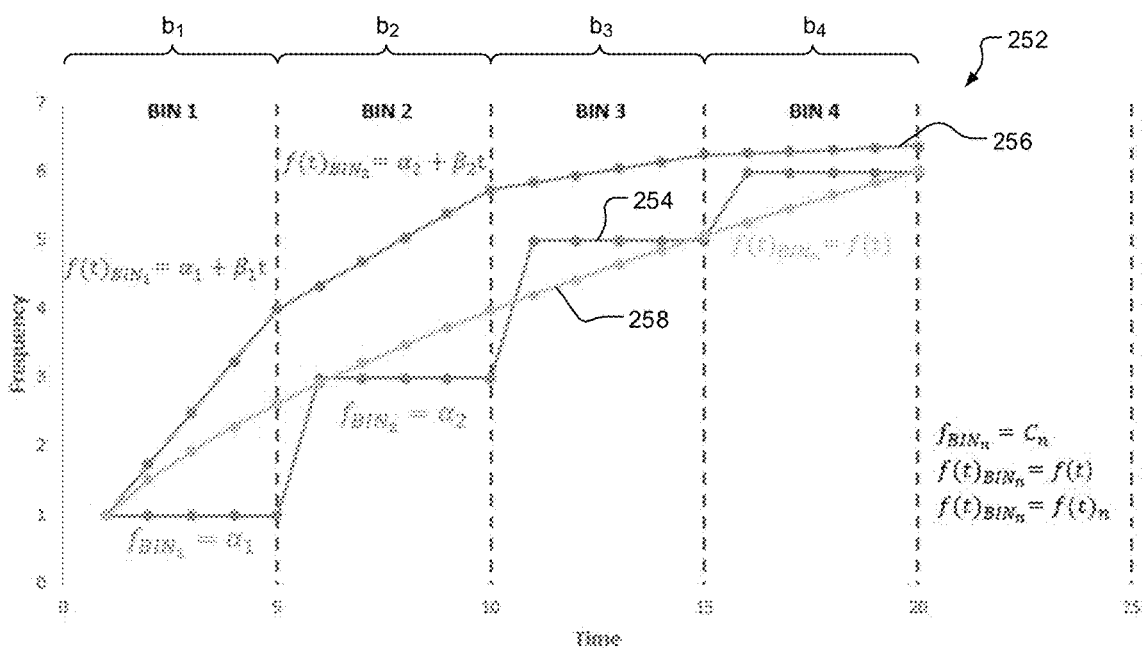
FIG. 29 depicts waveforms of frequency versus time for an implementation using bins in accordance with various embodiments.

FIG. 29 is a plot of frequency versus time and includes multiple waveforms that depict operation of a RF generator where a state or substate has four bins, $b_1, b_2, b_3, b_4$, also referred to, respectively, as bin 1, bin 2, bin 3, and bin 4. Plot 252 indicates respective waveforms 254, 256, and 258. Each bin of FIG. 29 includes five frequency settings or values, which correspond to a frequency settings or values of the RF at a particular time within a bin and within a corresponding pulse.

Waveform 254 indicates that within a bin, the frequency is maintained constant in accordance with the equation $f_{BIN_n} = \alpha_n$, where n indicates a respective bin. For example, $f_{BIN_1} = \alpha_1$ indicates a constant frequency $\alpha_1$ for bin $b_1$. Thus, waveform 254 defines a constant frequency for each bin $b_n$, and the constant frequency can vary from bin to bin. Waveform 256 indicates a plurality of frequencies within each bin, and the frequencies within each bin vary linearly, and the parameters of the respective lines associated with each bin can vary from bin to bin. The equation describing selection of frequencies can be understood as $f(t)_{BIN_n} = \alpha_n + \beta_n t$, where n indicates the particular bin and t is time. Thus, each bin has an offset frequency and a slope defined in accordance with $\alpha_n$ and $\beta_n$, respectively. Waveform 258 indicates that the frequencies with any particular bin vary from pulse to pulse in accordance with $f(t)_{BIN_n} = f(t)_n$. Thus, the frequency settings for waveform 258 depend upon the particular bin n and are varied in accordance with a function defined for each respective bin.

Figure 30:
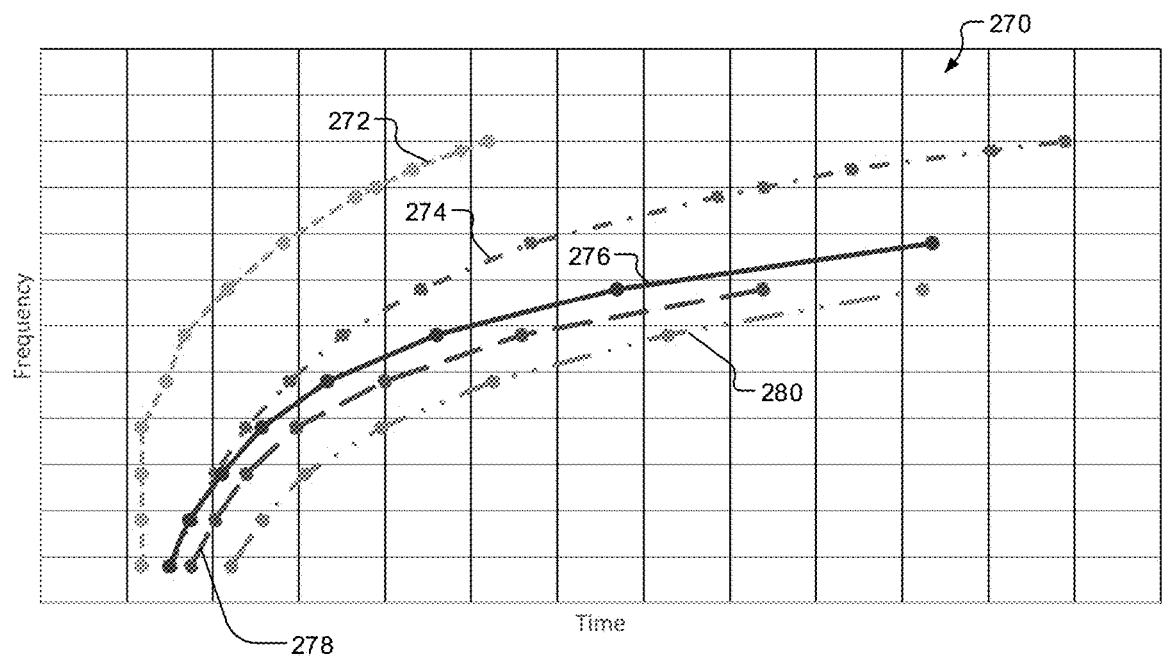
FIG. 30 depicts waveforms of time versus frequency over a burst state of a pulse.

FIG. 30 depicts a graph 270 showing multiple plots of time versus frequency. Time along the horizontal axis relates to the position of a state, substate or bin. The vertical axis indicates frequency so that the plot of time versus frequency indicates frequency setpoints selected to improve the impedance match. In various embodiments, the frequency setpoints for each bin are determined empirically individually or in combination with an iterative process. Waveform 272 indicates a set of frequencies for an RF generator configured to output 50 W. Waveform 274 is a plot of time versus frequency for a RF generator configured to output 100 W. Waveform 276 is a plot of time versus frequency for a RF generator configured to output 300 W. Waveform 278 is a plot of time versus frequency for a RF generator configured to output 600 W. Similarly, waveform 280 is a plot of frequency versus time for a RF generator configured to output 1,200 W. In various embodiments the vertical axis can represent approximately 10+/−5% of a center frequency of operation.

Figure 31:
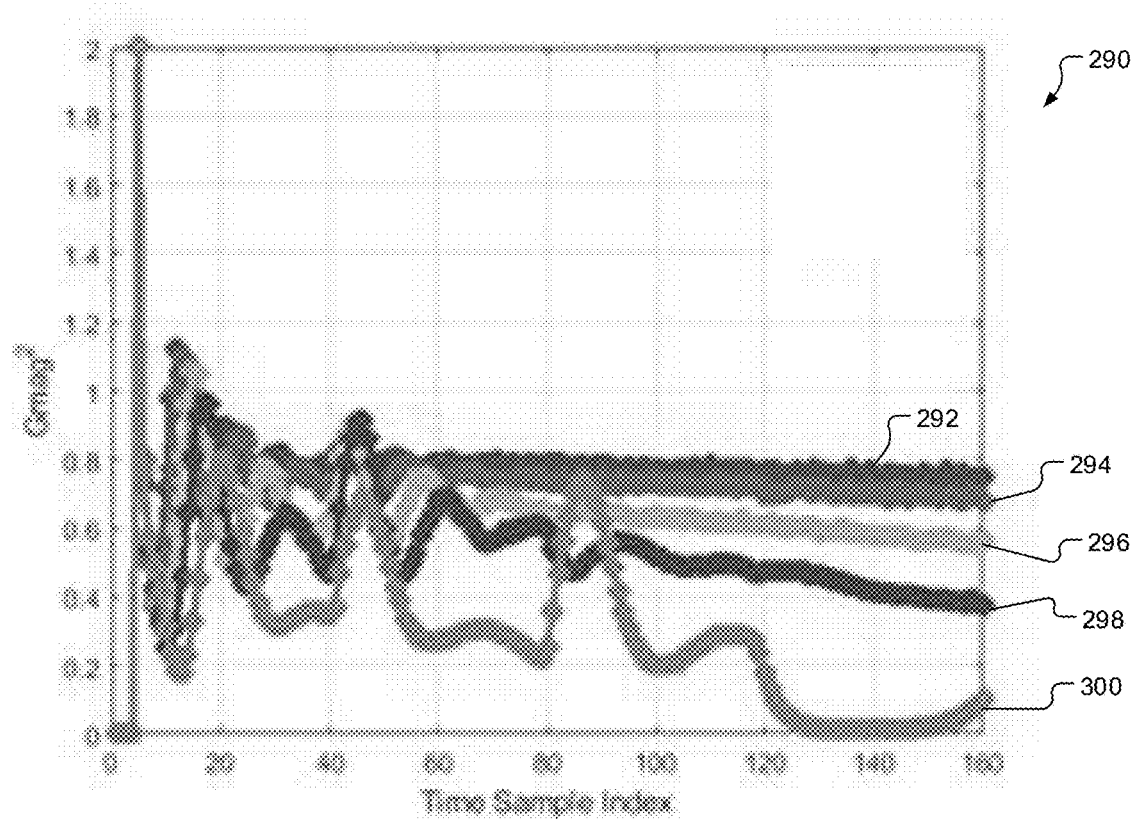
FIG. 31 depicts waveforms for updating the frequency of the individual bins of a burst state of a pulse.

FIG. 31 depicts a plot of time sample indexes versus a square of the reflection coefficient also known as the reflection ratio and indicates a trajectory for tuning the frequencies in order to obtain an optimal impedance match. In an iterative learning approach of FIG. 31, a burst state, such as state 124a was divided into four (n=4) subsections or bins and a predetermined number of time samples was taken for each bin. Within each bin, the frequency was varied linearly. In one approach, the iterative learning model, adjusted the slope and offset of the line in each bin to minimize the reflection coefficient, which maximizes delivered power. Each of plots 292, 294, 296, 298, and 300 of FIG. 31 indicates a respective pulse number. That is, in various embodiments, waveform 292, 294, 296, 298, 300 represent respective 1, 10, 20, 25, and 30 pulses.

Figure 32:
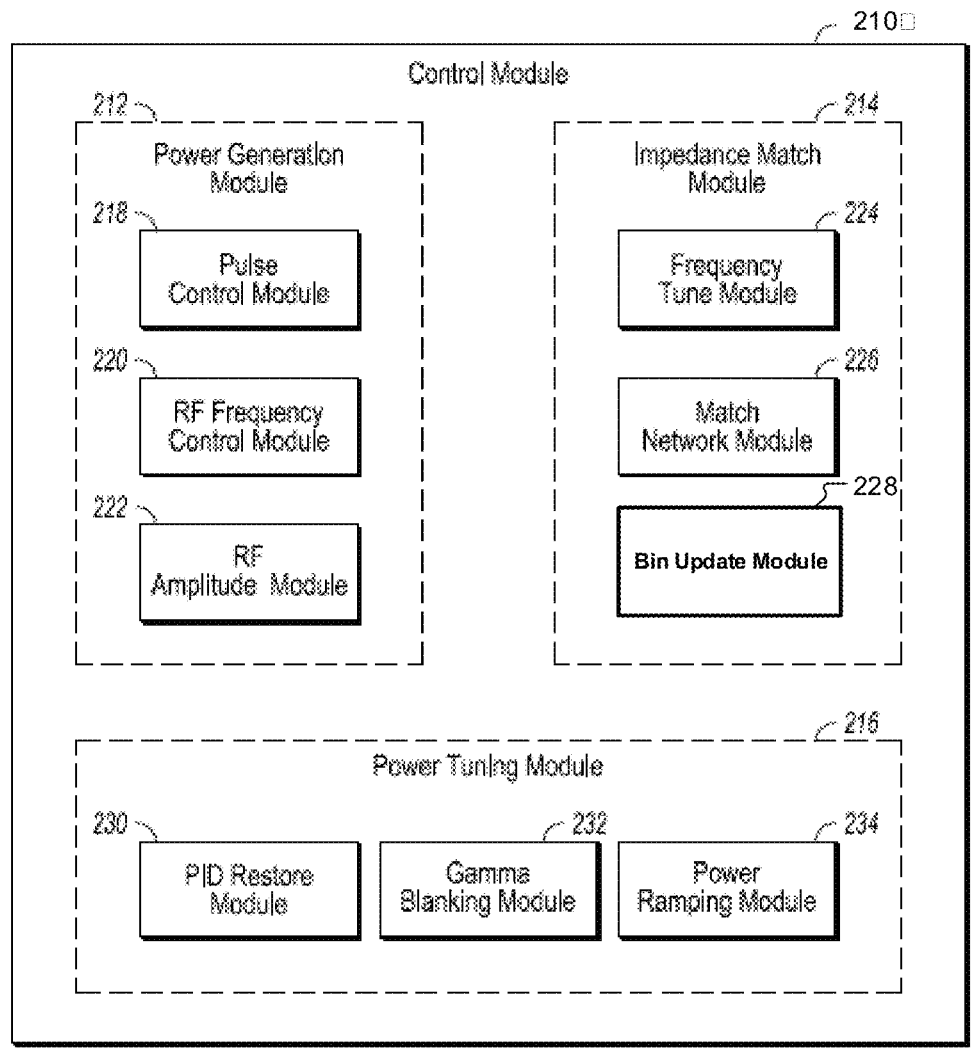
FIG. 32 depicts a functional block diagram of an example control module arranged in accordance with various embodiments.

FIG. 32 is a functional block diagram of an example control module arranged in accordance with the various embodiments. In FIG. 32, similar reference numbers of FIG. 26 will be used in FIG. 32. Thus, control module 210' of FIG. 32 is arranged similarly to FIG. 26, and the description above applies equally hereto. FIG. 32 also includes a bin update module 228, which is configured to update the frequency values, or other electrical parameters for each state, substate, or bin $b_x$ described above.

Figure 33:
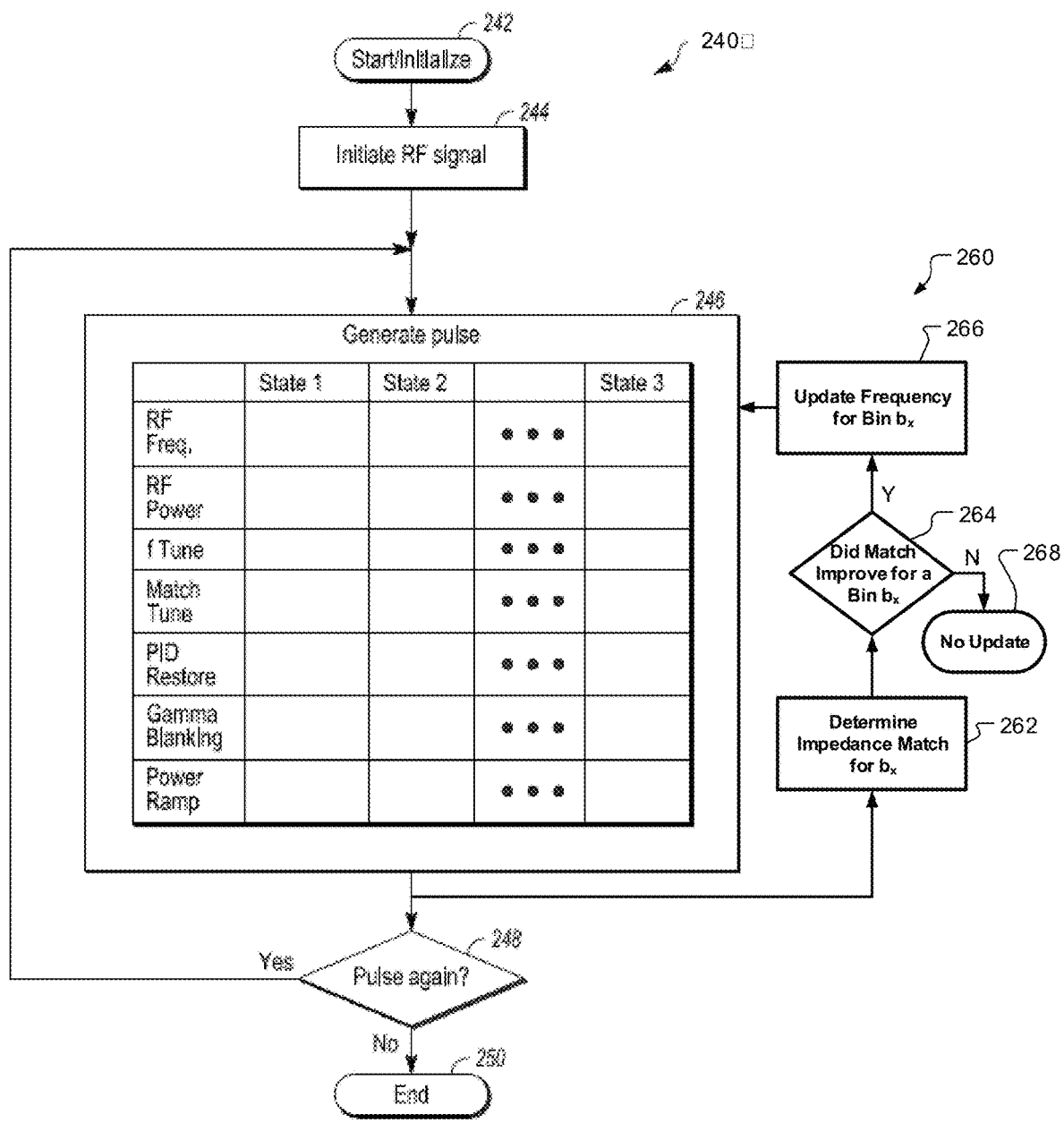
FIG. 33 depicts a flow chart of operation of a control system arranged in accordance with the principles of the present disclosure.

FIG. 33 shows a flowchart of a control system 240 for performing impedance control for the power delivery system of FIG. 1. FIG. 32 is arranged similarly to FIG. 27 and like reference numerals will be used to indicate similar functionality. Such similar functionality will not be repeated in the description of FIG. 33. Flow control system 240' is configured similarly to FIG. 27 and includes bin update section 260. Bin update section 260 includes a block 262 which determines an impedance match for bin $b_x$. Once the impedance match corresponding to bin $b_x$ is determined, block 264 determines if the impedance match improved for a particular bin $b_x$. If the impedance match improved, block 260 updates the frequency for bin $b_x$ so that future iterations of control system 240 uses updated frequencies. Returning to block 264, if the match did not improve, no update occurs as shown a block 268.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

In this application, apparatus elements described as having particular attributes or performing particular operations are specifically configured to have those particular attributes and perform those particular operations. Specifically, a description of an element to perform an action means that the element is configured to perform the action. The configuration of an element may include programming of the element, such as by encoding instructions on a non-transitory, tangible computer-readable medium associated with the element.

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. A RF generator comprising:
a RF power source generating an output signal including a RF signal modulated by a pulse that varies in accordance with power to be delivered to a load; and
a controller configured to control the pulse to include a plurality of states, wherein
in a first state, the controller is configured to control the RF generator to output the RF signal at a first power value and to control a frequency of the RF signal to a first frequency to vary an impedance between the RF generator and the load; and
in a second state, the controller is further configured in at least one of the following modes to:
(a) control the RF generator to output the RF signal at a second power value and control the frequency of the RF signal irrespective of the impedance between the RF generator and the load, wherein the first power value is a burst power and the second power value is a working power;
(b) control the RF generator to output the RF signal at the second power value and control the frequency of the RF signal to vary the impedance between the RF generator and the load, wherein the first power value is the burst power and the second power value is the working power;
(c) control the RF generator to output the RF signal at the second power value and control the frequency of the RF signal irrespective of the impedance between the RF generator and the load, wherein the first power value exceeds the second power value; or
(d) control the RF generator to output the RF signal at the second power value and control the frequency of the RF signal to vary the impedance between the RF generator and the load, wherein the first power value exceeds the second power value.

2. The RF generator of claim 1 wherein in modes (b) and (d), the frequency of the RF signal varies within a range of the frequency in accordance with the impedance between the RF generator and the load.

3. The RF generator of claim 1 wherein in modes (a) and (b), the first power value exceeds a boundary of the pulse and the second power value is bounded by the pulse.

4. The RF generator of claim 1 wherein the first state and the second state occur relative to a start of the pulse, and the first state occurs at the start of the pulse and the second state occurs following completion of the first state.

5. The RF generator of claim 1 wherein the controller is further configured to output a signal to initiate operation of a matching network between the RF generator and the load.

6. The RF generator of claim 1 wherein in modes (a) and (c), the controller is further configured to apply gamma blanking when outputting the first power value.

7. The RF generator of claim 1 wherein the first state includes a plurality of bins, and the controller is configured to control the RF generator for each bin to output the first frequency in accordance with a selected frequency associated with each of the plurality of bins, wherein the selected frequency associated with each of the plurality of bins varies for at least a pair of the plurality of bins.

8. The RF generator of claim 7 wherein the controller is configured to control the RF generator for each of the plurality of bins to output the first power value in accordance with a selected power value associated with each of the plurality of bins, wherein the selected power value associated with each bin varies for at least a pair of the plurality of bins.

9. The RF generator of claim 7 wherein the selected frequency associated with each of the plurality of bins for a next pulse is updated in accordance with at least one of an impedance match between the RF generator and the load and power delivered to the load for at least one prior pulse.

10. The RF generator of claim 7 wherein the selected frequency associated with each of the plurality of bins for a next pulse is updated in accordance with varying the frequency linearly within each of the plurality of bins and adjusting a slope and offset of a line defining a variation of the frequency to minimize the impedance between the RF generator and the load.

11. The RF generator of claim 1 wherein the controller is further configured to control the pulse to include a third state in which the controller is configured to control the RF generator to output the RF signal at a third power value and to control the frequency of the RF signal to a second frequency, wherein at least one of the third power value is not equal to one of the first power value or the second power value and the second frequency is not equal to the first frequency.

12. A RF generator system comprising:
a RF power source generating an output signal including a RF signal modulated by a pulse that varies in accordance power to be delivered to a load, wherein the pulse includes a plurality of states; and
a controller configured to control the RF power source, wherein
in a first state including a plurality of bins, the controller is configured in mode (a) to control the RF power source to output a plurality of frequencies within each bin, and the controller is configured to control the RF power source to output the RF signal at at least one first power value; and
in a second state, the controller is further configured in the mode (a) to control the RF power source to output the RF signal at a second power value.

13. The RF generator system of claim 12 wherein the at least one first power value and the second power value are bounded by the pulse.

14. The RF generator system of claim 12 wherein the at least one first power value is a burst power and the second power value is a working power, and the burst power exceeds a boundary of the pulse and the second power value are bounded by the pulse.

15. The RF generator system of claim 12 wherein in the second state, the controller is further configured in at least one of the following modes to:
(a) further control the RF power source to output a plurality of frequencies within each bin to a plurality of preselected frequencies;
(b) control the RF power source to output the RF signal at the second power value and control a respective frequency associated with each of the plurality of bins to vary impedance between the RF power source and the load, wherein the at least one first power value is a burst power and the second power value is a working power;
(c) control the RF power source to output a plurality of frequencies within each bin to a plurality of preselected frequencies, wherein the at least one first power value exceeds the second power value; or
(d) control the RF power source to output the RF signal at the second power value and control the respective frequency associated with each of the plurality of bins to vary the impedance between the RF power source and the load, wherein the at least one first power value exceeds the second power value.

16. The RF generator system of claim 15 wherein in modes (c) and (d), the at least one first power value and the second power value are bounded by the pulse.

17. The RF generator system of claim 15 wherein in modes (a) and (b), the at least one first power value exceeds a boundary of the pulse and the second power value is bounded by the pulse.

18. The RF generator system of claim 15 wherein in modes (a) and (c), the controller is further configured to apply gamma blanking while outputting the at least one first power value.

19. The RF generator system of claim 15 wherein in modes (b) and (d), the plurality of frequencies within each bin varies within a range of each respective frequency in accordance with the impedance between the RF power source and the load.

20. The RF generator system of claim 12 wherein the first state and the second state occur relative to a start of the pulse, and the first state occurs at the start of the pulse and the second state occurs following completion of the first state.

21. The RF generator system of claim 12 wherein the controller is further configured to output a signal to initiate operation of a matching network between the RF power source and the load.

22. The RF generator system of claim 12 wherein the controller is configured to control the RF power source to output a plurality of power values within each bin, wherein the plurality of power values varies for at least a pair of the plurality of bins.

23. The RF generator system of claim 12 wherein the plurality of frequencies within each bin for a next pulse is updated in accordance with at least one of an impedance between the RF power source and the load and power delivered to the load for at least one prior pulse.

24. The RF generator system of claim 12 wherein the plurality of frequencies within each bin for a next pulse is updated in accordance with varying the frequency within each bin linearly and adjusting a slope and offset of a line defining a variation of the frequency to minimize an impedance between the RF power source and the load.

25. The RF generator system of claim 12 wherein the controller is further configured to control the pulse to include a third state in which the controller is configured to control the RF power source to output the RF signal at a third power value and to control the frequency of the RF signal to a second frequency, wherein at least one of the third power value is not equal to one of the first power value or the second power value and the second frequency is not equal to the respective frequency associated with each of the plurality of bins.

26. A controller configured to control a pulse output by a RF power source, wherein the RF power source generates an output signal including a RF signal modulated by a pulse that varies in accordance power to be delivered to a load, wherein
a first state, the controller is configured to control the RF power source to output the RF signal at a first power value and to control a frequency of the RF signal to a first frequency to vary an impedance between the RF power source and the load; and
in a second state, the controller is further configured in a mode (a) to control the RF power source to output the RF signal at a second power value and control the frequency of the RF signal irrespective of the impedance between the RF power source and the load, wherein the first power value is a burst power and the second power value is a working power.

27. The controller of claim 26 further configured to in one of mode (a) or the following modes:
(b) control the RF power source to output the RF signal at the second power value and control the first frequency of the RF signal to vary the impedance between the RF power source and the load, wherein the first power value is the burst power and the second power value is the working power;
(c) control the RF power source to output the RF signal at the second power value and control the first frequency of the RF signal irrespective of the impedance between the RF power source and the load, wherein the first power value exceeds the second power value; or
(d) control the RF power source to output the RF signal at the second power value and control the first frequency of the RF signal to vary the impedance between the RF power source and the load, wherein the first power value exceeds the second power value.

28. The controller of claim 27 wherein in modes (b) and (d), the frequency of the RF signal varies within a range of the first frequency in accordance with the impedance between the RF power source and the load.

29. The controller of claim 27 wherein in modes (a) and (b), the first power value exceeds a boundary of the pulse and the second power value is bounded by the pulse.

30. The controller of claim 27 wherein the first state and the second state occur relative to a start of the pulse, and the first state occurs at the start of the pulse and the second state occurs following completion of the first state.

31. The controller of claim 26 wherein the first state includes a plurality of bins, and the controller is configured to control the RF power source for each bin to output the first frequency in accordance with a selected frequency associated with each of the plurality of bins, wherein the selected frequency associated with each of the plurality of bins varies for at least a pair of the plurality of bins.

32. The controller of claim 31 wherein the controller is configured to control the RF power source for each of the plurality of bins to output the first power value in accordance with a selected power value associated with each of the plurality of bins, wherein the selected power value associated with each of the plurality of bins varies for at least a pair of the plurality of bins.

33. The controller of claim 32 wherein the selected frequency associated with each of the plurality of bins for a next pulse is updated in accordance with at least one of the impedance match between the RF power source and the load and power delivered to the load for at least one prior pulse.

34. A method for controlling power delivery to a load comprising:
controlling a RF power generator to generate a RF output signal modulated by a pulse to vary power delivered to the load;
in a first state, controlling the RF generator to output the RF signal at a first power value at a first frequency to vary an impedance between the RF generator and the load; and
in a second state, controlling in a mode (a) to output the RF signal at a second power value and control the frequency of the RF signal irrespective of the impedance between the RF generator and the load, wherein the first power value is a burst power and the second power value is a working power.

35. The method of claim 34 wherein in the second state, controlling to one of mode (a) or the following modes:
(b) to output the RF signal at the second power value and control the frequency of the RF signal to vary the impedance between the RF generator and the load, wherein the first power value is the burst power and the second power value is the working power;
(c) to output the RF signal at the second power value and control the frequency of the RF signal irrespective of the impedance between the RF generator and the load, wherein the first power value exceeds the second power value; or
(d) to output the RF signal at the second power value and control the frequency of the RF signal to vary the impedance between the RF generator and the load, wherein the first power value exceeds the second power value.

36. The method of claim 35 wherein the first state and the second state occur relative to a start of the pulse, and the first state occurs at the start of the pulse and the second state occurs following completion of the first state.

37. The method of claim 34 wherein the first state includes a plurality of bins, and the controller is configured to control the RF generator for each bin to output the first frequency in accordance with a selected frequency associated with each of the plurality of bins, wherein the selected frequency associated with each of the plurality of bins varies for at least a pair of the plurality of bins.

38. The method of claim 37 wherein the controller is configured to control the RF generator for each of the plurality of bins to output the first power value in accordance with a selected power value associated with each of the plurality of bins, wherein the selected power value associated with each of the plurality of bins varies for at least a pair of the plurality of bins.

39. The method of claim 38 wherein the selected frequency associated with each of the plurality of bins for a next pulse is updated in accordance with at least one of the impedance match between the RF generator and the load and power delivered to the load for at least one prior pulse.

* * * * *